US006513433B2

(12) United States Patent
Inoue et al.

(10) Patent No.: US 6,513,433 B2
(45) Date of Patent: Feb. 4, 2003

(54) LITHOGRAPHIC PRINTING PLATE PRECURSOR

(75) Inventors: Nobuaki Inoue, Shizuoka (JP); Kazuo Maemoto, Shizuoka (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 0 days.

(21) Appl. No.: 09/833,638

(22) Filed: Apr. 13, 2001

(65) Prior Publication Data

US 2002/0007751 A1 Jan. 24, 2002

(30) Foreign Application Priority Data

Apr. 14, 2000 (JP) ....................................... 2000-113929

(51) Int. Cl.$^7$ ........................... B41C 1/055; B41N 1/14; G03F 7/004

(52) U.S. Cl. ........................ 101/457; 101/462; 430/302

(58) Field of Search ................................. 101/457, 462, 101/463.1, 465, 466, 467; 430/302

(56) References Cited

U.S. PATENT DOCUMENTS

| | | | | | |
|---|---|---|---|---|---|
| 4,004,924 | A | * | 1/1977 | Vrancken et al. | 101/470 |
| 5,569,573 | A | * | 10/1996 | Takahashi et al. | 101/453 |
| 6,357,353 | B1 | * | 3/2002 | Vermeersch et al. | 101/467 |

* cited by examiner

*Primary Examiner*—Stephen R. Funk
(74) *Attorney, Agent, or Firm*—Burns, Doane, Swecker & Mathis, LLP

(57) ABSTRACT

A lithographic printing plate precursor comprising a hydrophilic support having thereon a heat-sensitive layer containing at least one of a thermoplastic particulate polymer having Tg of not lower than 60° C., a particulate polymer having a heat-reactive group and a microcapsule containing a compound having a heat-reactive group incorporated therein.

9 Claims, No Drawings

LITHOGRAPHIC PRINTING PLATE PRECURSOR

FIELD OF THE INVENTION

The present invention relates to a negative-working lithographic printing plate precursor. More particularly, the present invention relates to a lithographic printing plate precursor which allows scanning exposure on the basis of digital signal to make a printing plate, exhibits a high sensitivity and a high impression capacity that can give a stain-free printed matter, and can be mounted undeveloped on the printing machine for printing.

BACKGROUND OF THE INVENTION

Many studies have been made of computer-to-plate system printing plates, which have recently shown a remarkable development. Under these circumstances, studies have been made of development-free lithographic printing plate precursors which can be mounted undeveloped on a printing machine after exposure so that it can be directly used for printing, aiming at further rationalization of procedure and solution to problem of disposal of waste liquid. Various methods have been proposed.

One of methods for eliminating these processing steps is a so-called on-the-machine development which comprises supplying a fountain solution and an ink onto an exposed printing plate precursor mounted on the cylinder of a printing machine while the cylinder is being rotated to remove the non-image area from the printing plate precursor. In accordance with the on-the-machine development process, all the processing steps are completed during ordinary printing procedure after the mounting of the exposed printing plate precursor on the printing machine.

The lithographic printing plate precursor suitable for such an on-the-machine development process needs to have a light-sensitive layer soluble in the fountain solution or ink solvent as well as daylight handleability suitable for development on the printing machine installed in daylight.

For example, Japanese Patent No. 2,938,397 discloses a lithographic printing plate precursor comprising a hydrophilic support having a light-sensitive layer having a particulate thermoplastic hydrophobic polymer dispersed in a hydrophilic binder polymer provided thereon. It is described in the above cited patent that the lithographic printing plate precursor is arranged such that when exposed to light from an infrared laser, thermal coalescence of the particulate thermoplastic hydrophobic polymer occurs to give a printing plate having an image formed thereon which is then mounted on the cylinder of a printing machine where it is then subjected to development with a fountain solution and/or ink.

However, the method involving the mere thermal coalescence allowing the formation of an image gives a good on-the-machine developability but is disadvantageous in that the resulting image strength gives an insufficient impression capacity. Further, when the heat-sensitive layer is provided directly on an aluminum substrate, the resulting heat is absorbed by the aluminum substrate, making it impossible to cause thermal coalescence on the substrate-heat-sensitive layer interface and hence giving an insufficient impression capacity.

JP-A-9-127683 (The term "JP-A" as used herein means an "unexamined published Japanese patent application"), JP-A-9-123387, JP-A-9-123388, JP-A-9-131850, and WO99-10186, too, disclose a method which comprises thermal coalescence of thermoplastic particles followed by on-the-machine development allowing the preparation of a printing plate. However, this approach, too, is disadvantageous in that the resulting image strength is weak, giving an insufficient impression capacity.

JP-A-8-48020 discloses a method which comprises subjecting a lipophilic heat-sensitive layer provided on a porous hydrophilic support to exposure to light from an infrared laser so that the lipophilic heat-sensitive layer is fixed to the substrate. However, this approach is disadvantageous in that such a lipophilic film exhibits a deteriorated on-the-machine developability, causing tailings of the lipophilic heat-sensitive layer to be attached to the ink roller or printed matters.

SUMMARY OF THE INVENTION

An object of the invention is to provide a lithographic printing plate precursor which can overcome the foregoing disadvantages of the prior art, i.e., lithographic printing plate precursor having a good on-the-machine developability, a high sensitivity and a high impression capacity.

In other words, the present invention provides a lithographic printing plate precursor comprising a hydrophilic support having thereon a heat-sensitive layer containing a thermoplastic particulate polymer having Tg of not lower than 60° C., and at least one of a particulate polymer having a heat-reactive group and a microcapsule containing a compound having a heat-reactive group incorporated therein.

It is thought that when subjected to heat mode exposure, the lithographic printing plate precursor according to the invention undergoes heat reaction of the microcapsules containing a particulate polymer having a heat-reactive group or a compound having a heat-reactive group incorporated in the heat-sensitive layer to enhance the strength on the image area and hence provide an excellent impression capacity. It is also thought that the thermoplastic particulate polymer which has once been melted becomes solidified when the temperature returns to ordinary value after exposure, whereby the strength can be further enhanced on the image area which has been exposed in a heat mode, providing better impression capacity.

DETAILED DESCRIPTION OF THE INVENTION

The present invention will be further described hereinafter.

The heat-sensitive layer to be incorporated in the lithographic printing plate precursor of the invention will be described first.

[Thermoplastic Particulate Polymer]

Preferred examples of the thermoplastic particulate polymer having Tg of not lower than 60° C. (hereinafter occasionally referred simply to as "thermoplastic particulate polymer") to be contained in the heat-sensitive layer of the lithographic printing plate of the invention include those disclosed in Research Disclosure No. 33303, January 1992, JP -A-9-123387, JP-A-9-131850, JP-A-9-171249, JP-A-9-171250, and EP931647. Specific examples of these thermoplastic particulate polymers include homopolymer and copolymer of monomers such as ethylene, styrene, vinyl chloride, methyl acrylate, ethyl acrylate, methyl methacrylate, ethyl methacrylate, vinylidene chloride, acrylonitrile and vinylcarbazole, and mixture thereof. Preferred among these polymers are polystyrene, and methyl polymethacrylate.

The thermoplastic particulate polymer to be contained in the heat-sensitive layer of the lithographic printing plate precursor of the invention preferably comprises at least two thermoplastic particulate polymers having different particle sizes or different Tg values.

In this arrangement, the resulting image area exhibits further improvement of hardness. The lithographic printing plate thus obtained exhibits further improvement of impression capacity.

For example, if the thermoplastic particulate polymer comprises particulate polymers having the same particle size, there is some void between the thermoplastic particulate polymer particles. Thus, even if the thermoplastic particulate polymer is subjected to exposure in a heat mode or the like to undergo melt-solidification, the resulting layer occasionally cannot have desired hardness. However, if the thermoplastic particulate polymer comprises particulate polymers having different particle sizes, the void between the thermoplastic particulate polymer particles can be reduced, making it possible to improve the hardness of the image area after exposure in a heat mode.

Further, in the case where the thermoplastic particulate polymer comprises particulate polymers having the same Tg value, if the rise of temperature of the heat-sensitive layer by exposure in a heat mode or the like is insufficient, the thermoplastic particulate polymer cannot undergo sufficient melt-solidification. Thus, the resulting layer cannot exhibit desired hardness. On the contrary, in the case where the thermoplastic particulate polymer comprises particulate polymers having different Tg values, even if the rise of temperature of the heat-sensitive layer by exposure in a heat mode or the like is insufficient, the resulting image area can exhibit improved hardness.

The average particle diameter of the foregoing thermoplastic particulate polymer is preferably from 0.005 $\mu$m to 2.0 $\mu$m. This can apply also to the case where two or more particulate polymers are mixed. The average particle diameter of the foregoing thermoplastic particulate polymer is more preferably from 0.01 $\mu$m to 1.5 $\mu$m, particularly from 0.05 $\mu$m to 1.0 $\mu$m. When the average particle diameter of the thermoplastic particulate polymer is too great, the resulting resolution is poor. On the contrary, when the average particle diameter of the thermoplastic particulate polymer is too small, the resulting aging stability is poor. The polydispersibility of the thermoplastic particulate polymer comprising two or more different particulate polymers is preferably 0.2 or more. When heat-fused, a thermoplastic particulate polymer comprising a particulate polymer having a great particle size and a particulate polymer having a small particle size in admixture has less void and thus provides an enhanced impression capacity. The polydispersibility and average particle diameter can be calculated by laser light scattering.

It is necessary that at least one of these thermoplastic particulate polymers have Tg of not lower than 60° C., particularly from 60° C. to 140° C., more preferably from 60° C. to 110° C. In the case where two or more thermoplastic particulate polymers having different Tg values are mixed, the difference in Tg between these thermoplastic particulate polymers is preferably not lower than 10° C., more preferably not lower than 20° C.

The added amount of these thermoplastic particulate polymers is preferably from 20 to 85% by weight, particularly from 30 to 70% by weight based on the solid content of the heat-sensitive layer.

[Particulate Polymer Having Heat-reactive Group]

For example, the particulate polymer having a heat-reactive group (hereinafter occasionally referred simply to as "particulate polymer") to be contained in the heat-sensitive layer of the lithographic printing plate precursor of the invention include ethylenically-unsaturated group which undergoes polymerization reaction (e.g., acryloyl group, methacryloyl group, vinyl group, allyl group), isocyanate group which undergoes addition reaction, block form thereof, functional group having active hydrogen atom, with which the isocyanate group or block form thereof reacts (e.g., amino group, hydroxyl group, carboxyl group), epoxy group which undergoes addition reaction, amino group, carboxyl group or hydroxyl group, with which the epoxy group reacts, carboxyl group, hydroxyl group or amino group which undergo condensation reaction, and acid anhydride, amino group or hydroxyl group which undergo ring-opening addition reaction. However, functional groups which undergo any reaction may be used so far as chemical bonds are formed.

Specific examples of the particulate polymer having a heat-reactive functional group to be contained in the heat-sensitive layer of the lithographic printing plate precursor of the invention include those having acryloyl group, methacryloyl group, vinyl group, allyl group, epoxy group, amino group, hydroxyl group, carboxyl group, isocyanate group, acid anhydride, and protective group thereof. The introduction of these functional groups into the particulate polymer may be carried out during the preparation of the particulate polymer or utilizing a high molecular reaction after the preparation of the particulate polymer.

In the case where the introduction of these functional groups into the particulate polymer is carried out during the preparation of the particulate polymer, the monomers having these functional groups are preferably subjected to emulsion polymerization or suspension polymerization.

Specific examples of the monomers having these functional groups include allyl methacrylate, allyl acrylate, vinyl methacrylate, vinyl acrylate, glycidyl methacrylate, glycidyl acrylate, 2-isocyanate ethyl methacrylate or block isocyanate thereof resulting from blocking with alcohol or the like, 2-isocyanate ethyl acrylate or block isocyanate thereof resulting from blocking with alcohol or the like, 2-aminoethyl methacrylate, 2-aminoethyl acrylate, 2-hydroxyethyl methacrylate, 2-hydroxyethyl acrylate, acrylic acid, methacrylic acid, maleic anhydride, bifunctional acrylate, and bifunctional methacrylate. However, the present invention is not limited to these monomers.

Examples of the monomers free of heat-reactive functional group which can be copolymerized with these monomers include styrene, alkyl acrylate, alkyl methacrylate, acrylonitrile, and vinyl acetate. However, the present invention is not limited to these monomers. Any monomers free of heat-reactive functional group may be used.

As the high molecular reaction to be effected in the case where the introduction of the heat-reactive functional group into the particulate polymer there may be used one disclosed in WO96-34316.

Among the foregoing particulate polymers having a heat-reactive functional group, preferred are those which undergo coalescence of polymer particles when heated. Particularly preferred are those having a hydrophilic surface which can be dispersed in water. It is preferred that the contact angle of the layer prepared by applying only the particulate polymer, and then drying the coat at a temperature lower than the freezing point thereof (with respect to water droplet in the air) be lower than that of the layer prepared by applying only the particulate polymer, and then drying the coat at a temperature higher than the freezing point thereof (with respect to water droplet in the air). Thus, in order to render the surface of the particulate polymer hydrophilic, a hydrophilic polymer or oligomer such as polyvinyl alcohol and polyethylene glycol or a hydrophilic low molecular compound may be adsorbed to the surface of the particulate polymer. However, the present invention is not limited to this method.

The freezing temperature of the particulate polymer having a heat-reactive functional group is preferably not lower than 70° C., more preferably not lower than 100° C. taking into account the aging stability.

The average particle diameter of the foregoing particulate polymer is preferably from 0.01 to 20 μm, more preferably from 0.05 to 2.0 μm, particularly from 0.1 to 1.0 μm. When the average particle diameter of the particulate polymer is too great, the resulting resolution is poor. On the contrary, when the average particle diameter of the particulate polymer is too small, the resulting aging stability is poor.

The added amount of the particulate polymer having a heat-reactive functional group is preferably from 1 to 50% by weight, more preferably from 5 to 30% by weight based on the solid content of the heat-sensitive layer.

[Microcapsule Containing a Compound Having a Heat-reactive Group]

The microcapsule to be contained in the heat-sensitive layer of the lithographic printing plate precursor of the invention encapsulates a compound having a heat-reactive group. As the compound having a heat-reactive functional group there may be used a compound having at least one functional group selected from the group consisting of polymerizable unsaturated group, hydroxyl group, carboxyl group, carboxylate group, acid anhydride, amino group, epoxy group, isocyanate group, and block form thereof.

Preferred examples of the compound having a polymerizable unsaturated group include a compound having at least one, preferably two or more, ethylenically unsaturated bonds such as acryloyl group, methacryloyl group, vinyl group and allyl group. Such a group of compounds are widely known in the art and can be used in the invention without any restriction. Examples of chemical form of the compound having a polymerizable unsaturated group include monomer, prepolymer, i.e., dimer, trimer and oligomer, mixture thereof, and copolymer thereof.

Examples of these compounds include unsaturated carboxylic acid (e.g., acrylic acid, methacrylic acid, itaconic acid, crotonic acid, isocrotonic acid, maleic acid), and ester and amide thereof. Preferred examples of these compounds include ester of unsaturated carboxylic acid with aliphatic polyvalent alcohol, and amide of unsaturated carboxylic acid with aliphatic polyvalent amine.

Further, adducts of unsaturated carboxylic acid esters and unsaturated carboxylic acid amide having a nucleophilic substituent such as hydroxyl group, amino group and mercapto group with monofunctional or polyfunctional isocyanates or epoxides, and dehydrocondensates of such unsaturated carboxylic acid esters and unsaturated carboxylic acid amide with monofunctional or polyfunctional carboxylic acids may be preferably used.

Moreover, adducts of unsaturated carboxylic acid esters or amides having an electrophilic substituent such as isocyanate group and epoxy group with monofunctional or polyfunctional alcohols, amines or thiols, and products of substitution reaction of unsaturated carboxylic acid esters or amides having a releasable substituent such as halogen group and tosyloxy group with monofunctional or polyfunctional alcohols, amines and thiols may be preferably used.

Further preferred examples of these compounds include compounds obtained by replacing the foregoing unsaturated carboxylic acid by unsaturated phosphonic acid or chloromethylstyrene.

Specific examples of the polymerizable compound which is an ester of unsaturated carboxylic acid with aliphatic polyvalent alcohol include ethylene glycol diacrylate, triethylene glycol diacrylate, 1,3-butanediol diacrylate, tetramethylene glycol diacrylate, propylene glycol diacrylate, neopentyl glcyol diacrylate, trimethylolpropane diacrylate, trimethylolpropane triacrylate, trimethylolpropane tris (acryloyloxypropyl)ether, trimethylolethane triacrylate, hexanediol diacrylate, 1,4-cyclohexanediol diacrylate, tetraethyleneglycol diacrylate, pentaerythritol diacrylate, pentaerythritol triacrylate, pentaerythritol tetraacrylate, dipentaerythritol diacrylate, dipentaerythritol pentaacrylate, dipentaerythritol hexaacrylate, sorbitol triacrylate, sorbitol tetraacrylate, sorbitol pentaacrylate, sorbitol hexaacrylate, tris(acryloyloxyethyl)isocyanurate, and polyester acrylate oligomer as acrylic acid ester, and, tetramethyleneglycol dimethacrylate, triethyleneglycol dimethacrylate, neopentylglycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloyloxy-2-hydroxypropoxy)phenyl]dimethylmethane, and bis-[p-(methacryloyloxyethoxy)phenyl]dimethylmethane as methacrylic acid ester.

Examples of the itaconic acid ester include ethylene glycol diitaconate, propylene glycol diitaconate, 1,3-butanediol diitaconate, 1,4-butanediol diitaconate, tetramethylene glycol diitaconate, pentaerythritol diitaconate, and sorbitol tetraitaconate.

Examples of the crotonic acid ester include ethylene glycol dicrotonate, tetramethylene glycol dicrotonate, pentaerythritol dicrotonate, and sorbitol tetradicrotonate.

Examples of the isocrotonic acid ester include ethylene glycol diisocrotonate, pentaerythritol diisocrotonate, and sorbitol tetraisocrotonate.

Examples of the maleic acid ester include ethylene glycol dimaleate, triethylene glycol diamaleate, pentaerythritol dimaleate, and sorbitol tetramaleate.

Examples of the other esters include aliphatic alcohol-based esters disclosed in JP-B-46-27926 (The term "JP-B" as used herein means an "examined Japanese patent application"), JP-B-51-47334, and JP-A-57-196231, esters having an aromatic skeleton disclosed in JP-A-59-5240, JP-A-59-5241, and JP-A-2-226149, and esters having an amino group disclosed in JP-A-1-165613.

Specific examples of the monomer which is an amide of aliphatic polyvalent amine compound with unsaturated carboxylic acid include methylene bisacrylamide, methylene bismethacrylamide, 1,6-hexamethylene bisacrylamide, 1,6-hexanemethylene bismethacrylamide, diethylenetriamine trisacylamide, xylylene bisacrylamide, and xylylene bismethacrylamide.

Preferred examples of the other amide monomers include those having a cyclohexylene structure disclosed in JP-B-54-21726.

Further, a urethane-based-addition-polymerizable compound prepared by the addition reaction of isocyanate with hydroxyl group may be preferably used. Specific examples of such a urethane-based addition-polymerizable compound include a urethane compound containing two or more polymerizable unsaturated groups per molecule obtained by adding an unsaturated monomer having a hydroxyl group represented by the following general formula (I) to a polyisocyanate compound having two or more isocyanate groups per molecular disclosed in JP-B-48-41708.

$$CH_2{=}C(R^1)COOCH_2CH(R^2)OH \quad (I)$$

wherein $R^1$ and $R^2$ each independently represent H or $CH_3$.

Further, urethane acrylates disclosed in JP-A-51-37193, JP-B-2-32293, and JP-B-2-16765, and urethane compounds having an ethylene oxide skeleton disclosed in JP-B-58-49860, JP-B-56-17654, JP-B-62-39417 and JP-B-62-39418 may be preferably used.

Moreover, radical-polymerizable compounds having an amino structure or sulfide structure in its molecule disclosed in JP-A-63-277653, JP-A-63-260909, and JP-A-1-105238 may be preferably used.

Other preferred examples of monomers include polyfunctional acrylates or methacrylates such as polyester acrylate and epoxy acrylate obtained by the reaction of epoxy resin with (meth)acrylic acid as disclosed in JP-A-48-64183, JP-B-49-43191, and JP-B-52-30490. Further preferred examples of monomers include specific compounds as disclosed in JP-B-46-43946, JP-B-1-40337, and JP-B-1-40336, and vinylsulfonic acid-based compounds as disclosed in JP-A-2-25493. Alternatively, compounds having perfluoroalkyl group as disclosed in JP-A-61-22048 may be preferably used. More alternatively, compounds disclosed as photo-setting monomers or oligomers in "Journal of Japan Adhesive Industry Association", vol. 20, No. 7, pp. 300–308, 1984 may be preferably used.

Preferred examples of the epoxy compound employable herein include glycerin polyglycidyl ether, polyethylene glycol glycidyl ether, polypropylene glycidyl ether, trimethylol propane polyglycidyl ether, sorbitol polyglycidyl ether, bisphenol, polyphenol and hydrogenated product thereof, namely, polyglycidyl ether thereof.

Preferred examples of the isocyanate compound employable herein include tolylene diisocyanate, diphenylmethane diisocyanate, polymethylene polyphenyl polyisocyanate, xylylene diisocyanate, naphthalene diisocyanate, cyclohexanephenylene diisocyanate, isophorone diisocyanate, hexamethylene diisocyanate, cyclohexyl diisocyanate, and compounds obtained by blocking these compounds with alcohol or amine.

Preferred examples of the amine compound employable herein include ethylenediamine, diethylenetriamine, triethylenetetramine, hexamethylenediamine, propylenediamine, and polyethyleneimine.

Preferred examples of the compound having hydroxyl group employable herein include compound having terminal methylol group, polyvalent alcohol such as pentaerythritol, and bisphenol-polyphenol.

Preferred examples of the compound having carboxyl group employable herein include aromatic polyvalent carboxylic acids such as pyromellitic acid, trimellitic acid and phthalic acid, and aliphatic polyvalent carboxylic acid such as adipic acid.

Preferred examples of the acid anhydride employable herein include pyromellitic anhydride, and benzophenonetetracarboxylic anhydride.

Preferred examples of the copolymer of ethylenically unsaturated compound employable herein include copolymer of allyl methacrylate. Specific examples of such a copolymer include allyl methacylate/methacrylic acid copolymer, allyl methacrylate/ethyl methacrylate copolymer, and allyl methacrylate/butyl methacrylate copolymer.

As the microcapsulization method there may be used any known method. Examples of the method of preparing microcapsule include a method utilizing coacervation as disclosed in U.S. Pat. Nos. 2,800,457 and 2,800,458, a method involving surface polymerization as disclosed in British Patent 990,443, U.S. Pat. No. 3,287,154, JP-A-38-19574, JP-A-42-446, and JP-A-42-711, a method involving the precipitation of polymer as disclosed in U.S. Pat. Nos. 3,418,250 and 3,660,304, a method involving the use of isocyanate polyol wall material as disclosed in U.S. Pat. No. 3,796,669, a method involving the use of isocyanate wall material as disclosed in U.S. Pat. No. 3,014,511, a method involving the use of urea-formaldehyde-based or urea formaldehyde-resorcinol-based wall-forming material as disclosed in U.S. Pat. Nos. 4,001,140, 4,087,376, and 4,089,802, a method involving the use of a wall-forming material such as melamine-formaldehyde resin and hydroxy cellulose as disclosed in U.S. Pat. No. 4,025,445, an in-situ method involving monomer polymerization as disclosed in JP-B-36-9163 and JP-B-36-9163, a spray drying method as disclosed in British Patent 930,422 and U.S. Pat. No. 3,111,407, and an electrolytic diffusion cooling method as disclosed in British Patents 952,807 and 967,074. However, the present invention is not limited to these methods.

The microcapsule wall which can be preferably used in the invention has a three-dimensional crosslink and swells with a solvent. From this standpoint of view, as the wall-forming material of microcapsule there is preferably used a polyurea, polyurethane, polyester, polycarbonate, polyamide or mixture thereof, particularly polyurea or polyurethane. The microcapsule wall may comprise a compound having a heat-reactive functional group incorporated therein.

The average particle diameter of the foregoing microcapsules is preferably from 0.01 to 20 μm, more preferably from 0.05 to 2.0 μm, particularly from 0.10 to 1.0 μm. When the average particle diameter of the microcapsules is too great, the resulting resolution is poor. On the contrary, when the average particle diameter of the microcapsules is too small, the resulting aging stability is deteriorated.

These microcapsules may or may not undergo coalescence when heated. In other words, among the compounds thus microcapsulized, those which have oozed to the surface of the capsule or out of the capsule during coating or those which have penetrated into the microcapsule wall may undergo chemical reaction when acted upon by heat. These compounds may react with the hydrophilic resin or low molecular compound added. Alternatively, two or more microcapsules may be provided with different functional groups which react with each other so that these microcapsules can each other.

Accordingly, it is preferred from the standpoint of image formation that microcapsules undergo melt-coalescence when acted upon by heat. However, this is not essential.

The amount of the microcapsules to be incorporated in the heat-sensitive layer is preferably from 10 to 60% by weight, more preferably from 15 to 40% by weight as calculated in terms of solid content. Within this range, good on-the-machine developability as well as good sensitivity and impression capacity can be provided.

In the case where the microcapsules are incorporated in the heat-sensitive layer, a solvent in which the capsulized material can be dissolved and with which the wall material swells may be incorporated in the microcapsule dispersion. The incorporation of such a solvent accelerates the diffusion of the compound having a heat-reactive functional group capsulized to the exterior of the microcapsules.

The kind of such a solvent depends on the microcapsule dispersion, the material of the microcapsule wall, the thickness of the microcapsule wall, and the material capsulized.

In practice, however, the solvent can be selected from many commercial solvents. For example, in the case of a water-dispersible microcapsule comprising a crosslinked polyurea or polyurethane wall, alcohols, ethers, acetals, esters, ketones, polyvalent alcohols, amides, amines, aliphatic acids, etc. are preferably used.

Specific examples of these compounds include methanol, ethanol, tertiary butanol, n-propanol, tetrahydrofuran, methyl lactate, ethyl lactate, methyl ethyl ketone, propylene glycol monomethyl ether, ethylene glycol diethyl ether, ethylene glycol monomethyl ether, γ-butyl lactone, N,N-dimethylformamide, and N,N-dimethylacetamide. However, the present invention is not limited to these compounds. Two or more of these solvents may be used in combination.

A solvent which cannot be dissolved in the microcapsule dispersion but can be dissolved in the microcapsule dispersion in the form of mixture with the foregoing solvents may be used. The amount of such a solvent to be added is determined depending on the combination of materials. When the amount of such a solvent falls below the optimum value, the resulting image forming properties are not sufficient. On the contrary, when the amount of such a solvent exceeds the optimum value, the resulting dispersion exhibits deteriorated stability. The effective amount of such a solvent is normally from 5 to 95% by weight, preferably from 10 to 90% by weight, more preferably from 15 to 85% by weight.

[Hydrophilic Resin]

The heat-sensitive layer of the lithographic printing plate precursor of the invention may comprise a hydrophilic resin incorporated therein. The incorporation of such a hydrophilic resin makes it possible to improve the on-the-machine developability as well as enhance the strength of the heat-sensitive layer itself. The hydrophilic resin is preferably not three-dimensionally crosslinked from the standpoint of on-the-machine developability.

As the hydrophilic resin there may be preferably used one having a hydrophilic group such as hydroxyl, carboxyl, hydroxyethyl, hydroxypropyl, amino, aminoethyl, aminopropyl and carboxymethyl. Specific examples of such a hydrophilic resin include gum arabic, casein, gelatin, starch derivative, carboxymethyl cellulose, sodium salt thereof, cellulose acetate, sodium alginate, vinyl acetate-maleic acid copolymer, styrene-maleic acid copolymer, polyacrylic acid, salt thereof, polymethacrylic acid, salt thereof, homopolymer and copolymer of hydroxyethyl methacrylate, homopolymer and copolymer of hydroxyethyl acrylate, homopolymer and copolymer of hydroxypropyl methacrylate, homopolymer and copolymer of hydroxybutyl methacrylate, homopolymer and copolymer of hydroxybutyl acrylate, polyethylene glycol, hydroxypropylene polymer, polyvinyl alcohol, and hydrolyzable polyvinyl acetate, polyvinyl formal, polyvinyl butyral, polyvinyl pyrrolidone, homopolymer and copolymer of acrylamide, homopolymer and copolymer of methacrylamide, homopolymer and copolymer of N-methylol acrylamide and homopolymer and copolymer of 2-acrylamide-2-methylpropanesulfonic acid and salt thereof having a hydrolyzability of at least 60% by weight, preferably at least 80% by weight.

The amount of the hydrophilic resin to be incorporated in the heat-sensitive layer is preferably from 2 to 40%, more preferably from 3 to 30%. When the amount of the hydrophilic resin falls below 2%, the resulting heat-sensitive layer has a deteriorated strength. On the contrary, when the amount of the hydrophilic resin exceeds 40%, the resulting lithographic printing plate precursor exhibits an improved on-the-machine developability but a deteriorated impression capacity.

[Compound Initiating or Accelerating Reaction]

The heat-sensitive layer of the lithographic printing plate precursor of the invention comprises microcapsules containing a particulate polymer having the foregoing heat-reactive group or a compound having a heat-reactive group and thus may comprise a compound initiating or accelerating the reaction thereof incorporated therein as necessary. As such a compound there may be used a compound which generates a radical or cation when acted upon by heat. Examples of such a compound include lophine dimer, trihalomethyl compound, peroxide, azo compound, onium salt containing diazonium salt or diphenyl iodonium salt, acyl phosphine, and imide sulfonate.

The foregoing compound may be incorporated in the heat-sensitive layer in an amount of from 1 to 20% by weight, preferably from 3 to 10% by weight. When the amount of the foregoing compound to be incorporated exceeds the above defined range, the resulting effect of initiating or accelerating reaction is deteriorated, worsening impression capacity.

In the case where microcapsules containing a compound having a heat-reactive group are used, a compound which initiates or accelerates reaction is preferably contained in the microcapsules to cause reaction efficiently. By containing such a compound in the microcapsules, the compound can be previously mixed thoroughly with the compound having a heat-reactive group, making it possible to cause reaction while the material capsulated is being dispersed when irradiated with laser beam. In this manner, the impression capacity of the lithographic printing plate of the invention can be further enhanced.

[Other Additives]

In the present invention, the light-sensitive layer may further comprise various compounds incorporated therein besides the foregoing compounds as necessary.

For example, a low molecular compound having a functional group reactive with the heat-reactive group contained in the particulate polymer or the compound having the heat-reactive group contained in the microcapsules and a group for protecting the functional group may be incorporated in the heat-sensitive layer. The amount of such a low molecular compound to be incorporated in the heat-sensitive layer is preferably from 5 to 40% by weight, particularly from 5 to 20% by weight based on the weight of the heat-sensitive layer. When the amount of such a low molecular compound to be incorporated falls below the above cited range, the resulting crosslinking effect is small, giving insufficient impression capacity. On the contrary, when the amount of such a low molecular compound to be incorporated exceeds the above cited range, the resulting lithographic printing plate precursor can exhibit a deteriorated on-the-machine developability after aging. Specific examples of such a compound include those described with reference to the compound having a heat-reactive group to be contained in the microcapsules.

As an image colorant there may be used a dye having a great absorption in the visible light range. Specific examples of such a dye include oil yellow #101, oil yellow #103, oil pink #312, oil green BG, oil blue BOS, oil blue #603, oil black BY, oil black BS, oil black T-505 (produced by Orient Chemical Industries Limited), victoria pure blue, crystal violet (CI42555), methyl violet (CI42535), ethyl violet, rhodamine B (CI145170B), malachite green (CI42000), methylene blue (CI52015), and dyes disclosed in JP-A-62-293247. Alternatively, pigments such as phthalocyanine pigment, azo pigment, carbon black and titanium oxide may be preferably used.

These colorants are preferably added to make it easy to distinguish between the image area and the non-image area after the formation of image. The amount of these colorants to be incorporated is from 0.01 to 10% by weight based on the total solid content of the heat-sensitive layer coating solution.

In the present invention, a small amount of a heat polymerization initiator is preferably incorporated to prevent unnecessary heat polymerization of a compound having a radical-polymerizable ethylenically unsaturated double bond during the preparation or storage of the heat-sensitive layer coating solution. Examples of suitable heat polymerization initiators include hydroquinone, p-methoxyphenol, di-t-butyl-p-cresol, pyrogallol, t-butyl catechol, benzoquinone, 4,4'-thiobis(3-methyl-6-t-butylphenol), 2,2'-methylenebis(4-methyl-6-t-butylphenol), 2,2'-methylenebis (4-methyl-6-t-butylphenol), and N-nitroso-N-phenylhydroxylamine aluminum salt. The amount of the heat polymerization initiator to be incorporated is preferably from about 0.01 to 5% by weight based on the total weight of the compositions. If necessary, in order to prevent the inhibition of polymerization by oxidation, a higher aliphatic acid derivative such as behenic acid and behenic acid amide or the like may be added so that it is unevenly distributed on the surface of the heat-sensitive layer. The amount of such a higher aliphatic acid derivative to be incorporated is preferably from about 0.1 to 10% by weight based on the total weight of the compositions.

The heat-sensitive layer coating solution of the invention may comprise a nonionic surface active agent disclosed in JP-A-62-251740 and JP-A-3-208514 or an amphoteric surface active agent disclosed in JP-A-59-121044 and JP-A-4-13149 incorporated therein to expand the stability of processing against the developing conditions. Specific examples of the non-ionic surface active agent employable herein include sorbitan tristearate, sorbitan monopalmitate, sorbitan trioleate, monoglyceride stearate, and polyoxyethylene nonylphenyl ether.

Specific examples of the amphoteric surface active agent employable herein include alkyl di(aminoethyl)glycine, alkyl polyaminoethyl glycine hydrochloride, 2-alkyl-N-carboxyethyl-N-hydroxyethyl imidazolinium betaine, and N-tetradecyl-N,N-betaine type surface active agent (e.g., Amogen K, produced by DAI-ICHI KOGYO SEIYAKU CO., LTD).

The proportion of the foregoing non-ionic surface active agent and amphoteric surface active agent in the heat-sensitive layer coating solution is preferably from 0.05 to 15% by weight, more preferably from 0.1 to 5% by weight.

The heat-sensitive layer coating solution according to the invention may comprise a plasticizer for rendering the coat layer flexible as necessary. Examples of the plasticizer employable herein include polyethylene glycol, tributyl citrate, diethyl phthalate, dibutyl phthalate, dihexyl phthalate, dioctyl phthalate, tricresyl phosphate, tributyl phosphate, trioctyl phosphate, and tetrahydrofurfuryl oleate.

In order to prepare the lithographic printing plate precursor of the invention, a solution of the foregoing various components required for heat-sensitive layer coating solution in a solvent may be normally applied to a proper support. Examples of the solvent employable herein include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethyl sulfoxide, sulfolane, γ-butyrolactone, toluene, and water. However, the present invention is not limited to these solvents. These solvents may be used singly or in admixture. The concentration of the foregoing components (total solid content containing additives) in the solvent is preferably from 1 to 50% by weight.

The coated amount (solid content) of the heat-sensitive layer which has been applied and dried on the support depends on the purpose. In practice, however, it is preferably from 0.5 to 5.0 $g/m^2$ for the lithographic printing plate precursor. The application of the coating solution can be accomplished by various methods. Examples of these methods include bar coater coating method, rotary coating method, spray coating method, curtain coating method, dip coating method, air knife coating method, blade coating method, and roll coating method. As the coated amount decreases, the apparent sensitivity increases but the properties of the heat-sensitive layer which acts to record image deteriorate.

The heat-sensitive layer coating solution of the invention may comprise a surface active agent for improving the coatability thereof, e.g., fluorine-based surface active agent as disclosed in JP-A-62-170950 incorporated therein. The amount of such a surface active agent to be incorporated is preferably from 0.01 to 1% by weight, more preferably from 0.05 to 0.5% by weight based on the total solid content of the materials constituting the heat-sensitive layer.

[Overcoat Layer]

The lithographic printing plate precursor of the invention preferably comprises a water-soluble overcoat layer provided on the heat-sensitive layer to prevent the surface of the heat-sensitive layer from being contaminated by lipophilic materials. The water-soluble overcoat layer to be used in the invention is designed to be easily removed at the time of printing and thus comprises a resin selected from the group consisting of water-soluble organic polymers. As the water-soluble organic polymer there may be used one which can be applied and dried to form a film-forming coat layer. Specific examples of the water-soluble organic polymer employable herein include polyvinyl acetate (having a percent hydrolyzation of not lower than 65%), polyacrylic acid and alkaline metal or amine salt thereof, polyacrylic acid copolymer and alkaline metal or amine salt thereof, polymethacrylic acid and alkaline metal or amine salt thereof, polymethacrylic acid copolymer and alkaline metal or amine salt thereof, polyacrylamide and copolymer thereof, polyvinyl methyl ether, polyvinyl methyl ether/maleic anhydride copolymer, poly-2-acrylamide-2-methyl-1-propanesulfonic acid and alkaline metal or amine salt thereof, poly-2-acrylamide-2-methyl-1-propanesulfonic acid copolymer and alkaline metal or amine salt thereof, gum arabic, cellulose (e.g., carboxymethyl cellulose, carboxyethyl cellulose, methyl cellulose) and modification product thereof, white dextrin, pullulan, and enzymatically decomposed etherified dextrin. Two or more of these resins may be used in admixture depending on the purpose.

Further, the overcoat layer preferably comprises a water-soluble light-to-heat converting agent described later incorporated therein. Moreover, the overcoat layer, if it is in the form of aqueous coating solution, may comprise a nonionic surface active agent such as polyoxyethylene nonyl phenyl ether and polyoxyethylene dodecyl ether incorporated therein for the purpose of securing uniformity in coating.

The dried coated amount of the overcoat layer is preferably from 0.1 to 2.0 $g/m^2$. When the dried coated amount of the overcoat layer falls below the above cited range, the resulting lithographic printing plate precursor can be stained with fingerprints. On the contrary, when the dried coated amount of the overcoat layer exceeds the above cited range, the resulting lithographic printing plate precursor exhibits a deteriorated on-the- machine developability.

[Light-to-heat Converting Agent]

The lithographic printing plate precursor of the invention can comprise a light-to-heat converting material incorporated therein in the heat-sensitive layer or its adjacent layers, more preferably in the overcoat layer, so that it allows image writing by irradiation with laser beam.

The light-to-heat converting material to be used in the invention is not specifically limited so far as it is a material capable of absorbing light having the wavelength of the light source such as carbon black, particulate metal and dye. In practice, however, a compound which absorbs infrared rays and then converts it to heat is desirable.

In particular, the light-to-heat converting material is preferably a material capable of absorbing light having a wavelength of not lower than 700 nm. Various pigments and dyes can be used. Examples of the pigment employable herein include commercially available pigments, and pigments described in Color Index (C.I.) Handbook, "Saishin Ganryou Binran (Handbook of Modern Pigments)", Nihon Ganryou Gijutsu Kyoukai, 1977, "Saishin Ganryou Ouyou Gijutsu (Modern Technology of Application of Pigments)", CMC, 1986, and "Insatsu Inki Gijutsu (Printing Ink Technology)", CMC, 1984.

Examples of the kind of the pigment employable herein include black pigment, brown pigment, red pigment, violet pigment, blue pigment, green pigment, fluorescent pigment, metal powder pigment, and polymer bond dye. Specific examples of these pigments include insoluble azo pigment, azo lake pigment, condensed azo pigment, chelate azo pigment, phthalocyanine pigment, anthraquinone pigment, perylene pigment, perynone pigment, thioindigo pigment, quinacridone pigment, dioxazine pigment, isoindolinone pigment, quinophthalone pigment, dyed lake pigment, azine pigment, nitroso pigment, natural pigment, fluorescent pigment, inorganic pigment, and carbon black.

These pigments may or may not be subjected to surface treatment before use. Proposed examples of surface treatment method include a method involving the coating of the surface of pigment with a hydrophilic resin or lipophilic resin, a method involving the attachment of a surface active agent to the surface of pigment, and a method involving the bonding of a reactive material (e.g., silica sol, alumina sol, silane coupling agent, epoxy compound, isocyanate compound) to the surface of pigment. These surface treatment methods are further described in "Kinzoku Sekken no Seishitsu to Ouyou (Properties and Application of Metallic Soap)", Saiwai Shobo, "Insatsu Inki Gijutsu (Printing Ink Technology)", CMC, 1986. Particularly preferred among these pigments are those capable of absorbing infrared rays or near infrared rays because they are suitable for use with laser emitting infrared rays or near infrared rays.

As such a pigment capable of absorbing infrared rays or near infrared rays there may be preferably used carbon black, carbon black coated with a hydrophilic resin or carbon black modified with silica sol. Useful among these pigments is carbon black coated with a hydrophilic resin or silica sol because it can be easily dispersed with a water-soluble resin and doesn't impair the hydrophilicity of the lithographic printing plate precursor.

The particle diameter of the pigment is preferably from 0.01 $\mu$m to 1 $\mu$m, more preferably from 0.01 $\mu$m to 0.5 $\mu$m. As a method for dispersing the pigment there may be used any known dispersion method for use in the preparation of ink or toner. Examples of dispersing machines employable herein include ultrasonic dispersing machine, sand mill, attritor, pearl mill, super mill, impeller, disperser, KD mill, colloid mill, dynatron, three-roll mill, and pressure kneader. These dispersing machines are further described in "Saishin Ganryou Ouyou Gijutsu (Modern Technology of Application of Pigments)", CMC, 1986.

Examples of the dye employable herein include commercially available dyes, and known dyes described in literatures (e.g., "Senryou Binran (Handbook of Dyes)", The Society of Synthetic Organic Chemistry, Japan, 1970. Specific examples of these dyes include azo dye, metal complex salt-azo dye, pyrazolone azo dye, anthraquinone dye, phthalocyanine dye, carbonium dye, quinoneimine dye, methine dye, and cyanine dye. Particularly preferred among these dyes are those capable of absorbing infrared rays or near infrared rays because they are suitable for use with laser emitting infrared rays or near infrared rays.

Examples of the dye capable of absorbing infrared rays employable herein include cyanine dyes disclosed in JP-A-58-125246, JP-A-59-84356, JP-A-60-78787, U.S. Pat. No. 4,974,572, and JP-A-10-268512, methine dyes disclosed in JP -A-58-173696, JP-A-58-181690, and JP-A-58-194595, naphthoquinone dyes disclosed in JP -A-58-112793, JP-A-58-224793, JP-A-59-48187, JP-A-59-73996, JP-A-60-52940, and JP-A-60-63744, squarilium dyes disclosed in JP-A-58-112792, cyanine dyes disclosed in British Patent 434,875, dyes disclosed in U.S. Pat. No. 4,756,993, cyanine dyes disclosed in U.S. Pat. No. 4,973,572, and dyes disclosed in JP-A-10-268512.

(I)

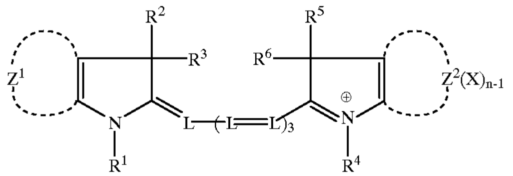

wherein $R^1$, $R^2$, $R^3$, $R^4$, $R^5$, and $R^6$ each independently represent a substituted or unsubstituted alkyl group; $Z^1$ and $Z^2$ each independently represent a substituted or unsubstituted phenyl or naphthalene group; L represents a substituted or unsubstituted methine group in which the substituent may be an alkyl group having 8 or less carbon atoms, halogen atom or amino group or the methine group may contain a cyclohexene ring or cyclopentene ring which may have a substituent formed by connecting the substituents on the two methine carbons to each other, said substituent being an alkyl group having 6 or less carbon atoms or a halogen atom; X represents an anion group; and n represents an integer of 1 or 2, with the proviso that at least one of $R^1$, $R^2$, $R^3$, $R^4$, $R^5$, $R^6$, $Z^1$ and $Z^2$ represents a substituent containing an acidic group or a salt of acidic group with alkaline metal or amine.

(II)

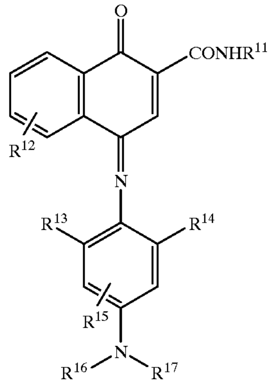

wherein $R^{11}$ represents a substituted or unsubstituted alkyl group, substituted or unsubstituted aryl group or substituted or unsubstituted heterocyclic group; $R^{12}$ and $R^{15}$ each independently represent a hydrogen atom or a group which can substitute instead of hydrogen atom; $R^{13}$ and $R^{14}$ each independently represent a hydrogen atom, halogen atom, substituted or unsubstituted alkoxy group or substituted or unsubstituted alkyl group, with the proviso that $R^{13}$ and $R^{14}$ are not a hydrogen atom at the same time; and $R^{16}$ and $R^{17}$ each independently represent a substituted or unsubstituted alkyl, acyl or sulfonyl group or $R^{16}$ and $R^{17}$ together form a nonmetallic 5- or 6-membered ring.

As the dye there may be preferably used a near infrared-absorbing sensitizer disclosed in U.S. Pat. No. 5,156,938. Particularly preferred examples of the dye employable herein include substituted arylbenzo(thio)pyrilium salts disclosed in U.S. Pat. No. 3,881,924, trimethine thiapyrilium salts disclosed in JP-A-57-142645 (corresponding to U.S. Pat. No. 4,327,169), pyrilium-based compounds disclosed in JP-A-58-181051, JP-A -58-220143, JP-A-59-41363, JP-A-59-84248, JP-A-59-84249, JP-A-59-146063, and JP -A-59-146061, cyanine dyes disclosed in JP-A-59-216146, pentamethine thiopyrilium salts disclosed in U.S. Pat. No. 4,283,475, pyrilium compounds disclosed in JP-B-5-13514 and JP-B-5-19702, and Epolight III-178, Epolight III-130, and Epolight III-125 produced by Epolin Inc.

Particularly preferred among these dyes is the water-soluble cyanine dye represented by the foregoing general formula (I).

Specific examples of these compounds will be given below.

(I-1)

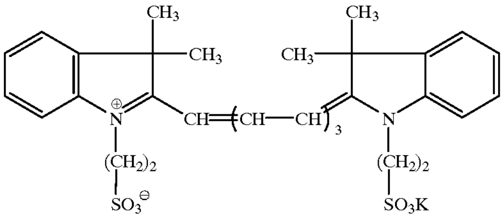

(I-2)

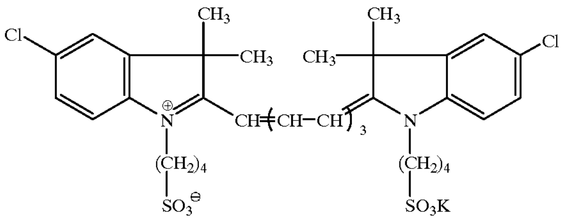

(I-3)

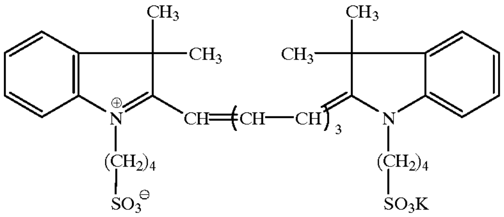

(I-4)

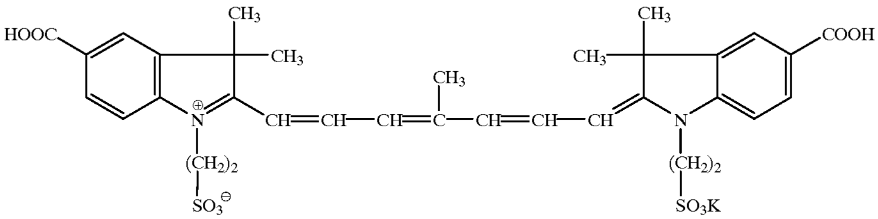

(I-5)

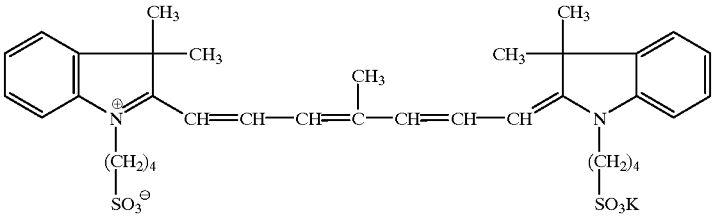

(I-6)

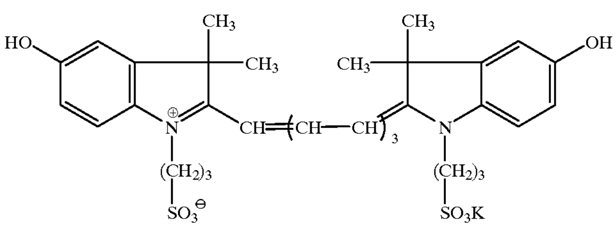

(I-7)

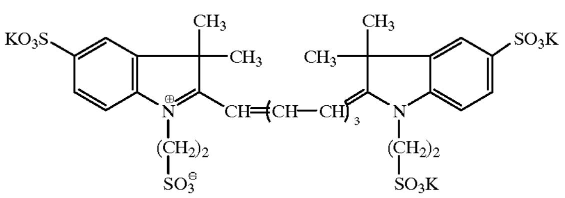

-continued
(I-8)
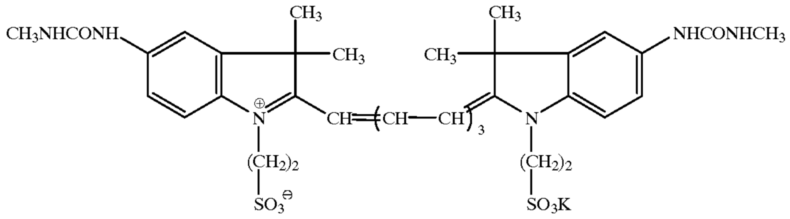
(I-9)
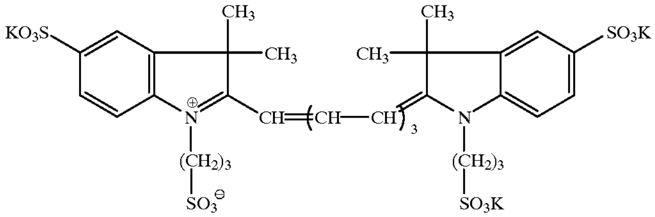
(I-10)
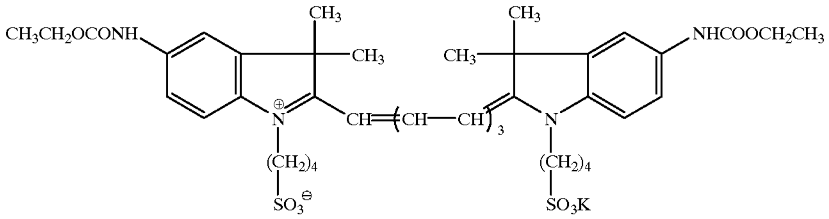
(I-11)
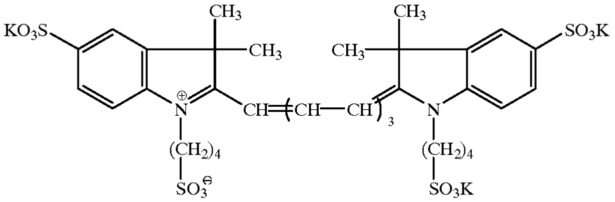
(I-12)
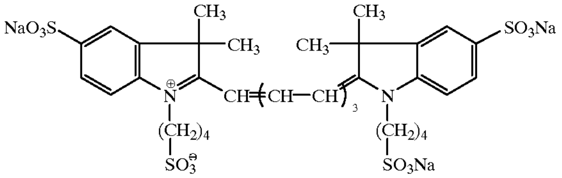
(I-13)
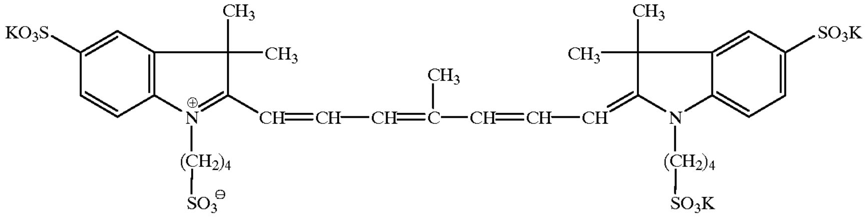
(I-14)
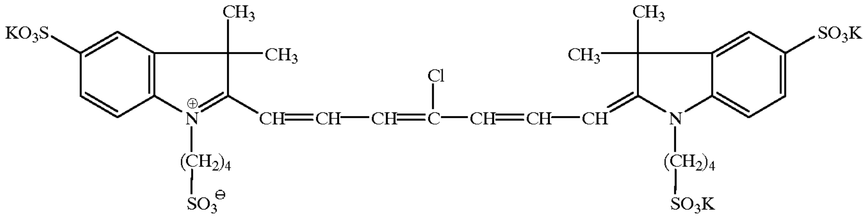

-continued
(I-15)
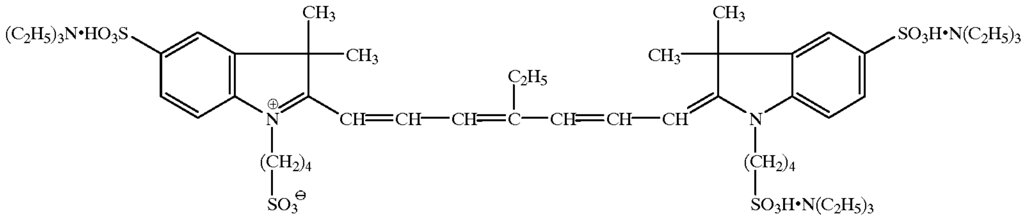
(I-16)
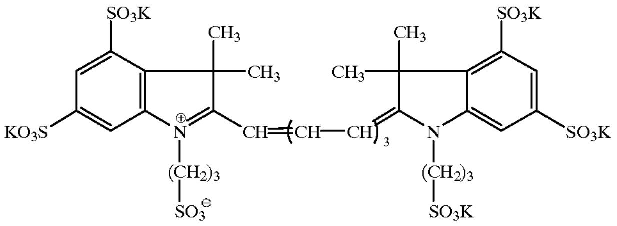
(I-17)
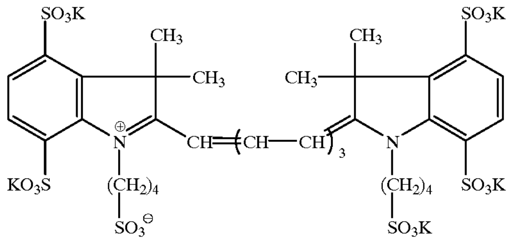
(I-18)
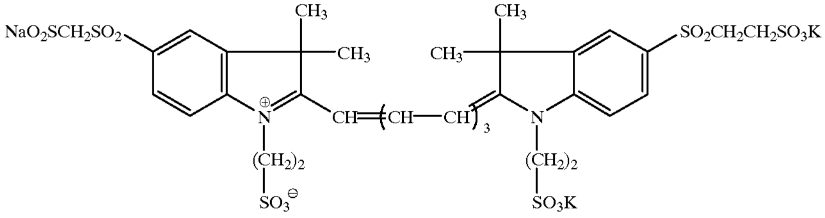
(I-19)
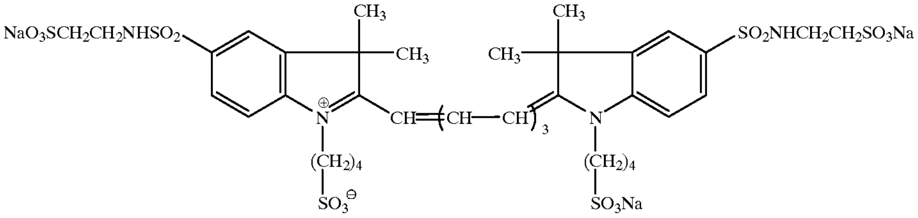
(I-20)
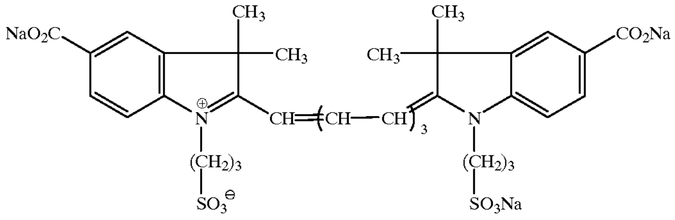
(I-21)
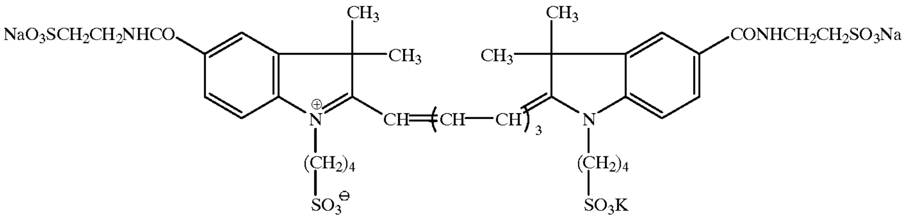

-continued
(I-22)
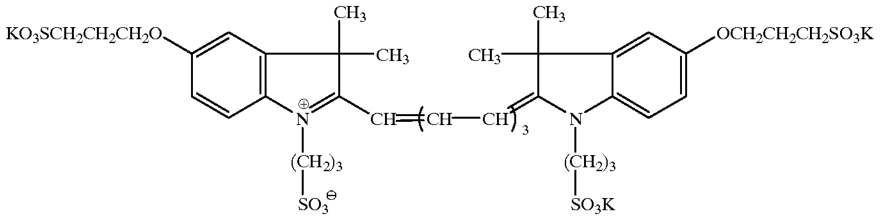
(I-23)
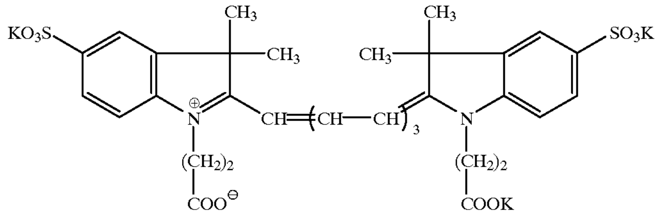
(I-24)
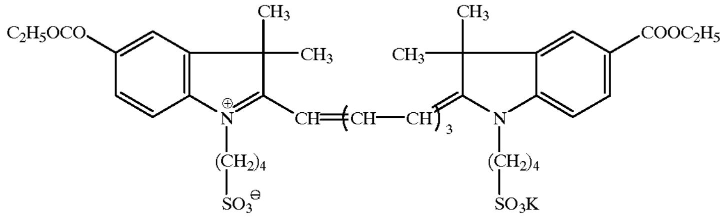
(I-25)
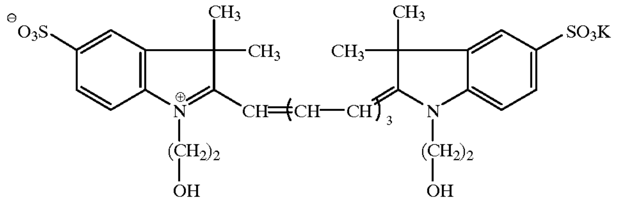
(I-26)
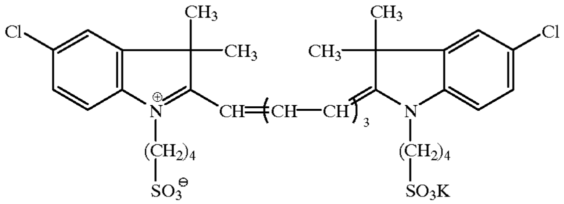
(I-27)
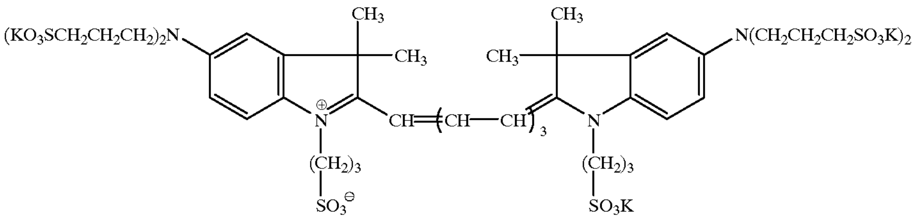
(I-28)
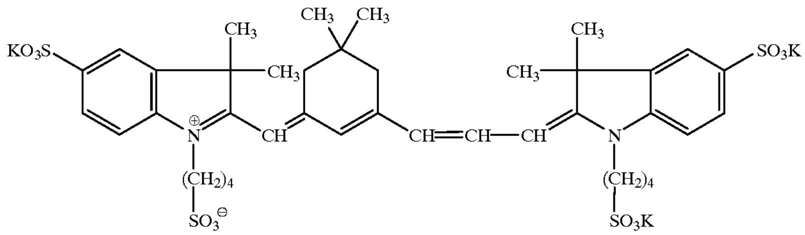

-continued (I-29)

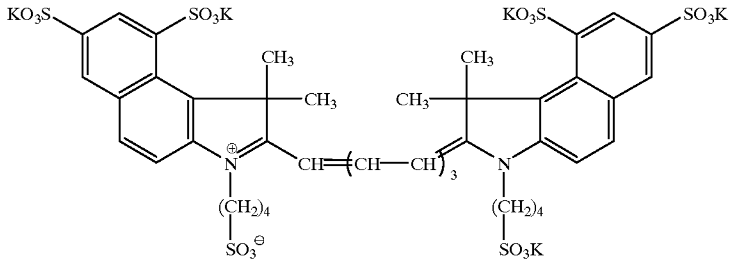

(I-30)

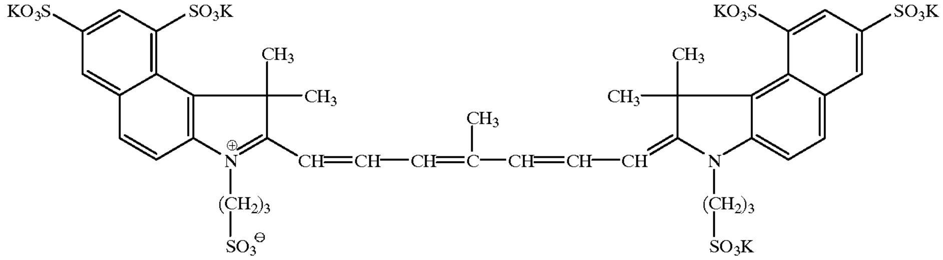

(I-31)

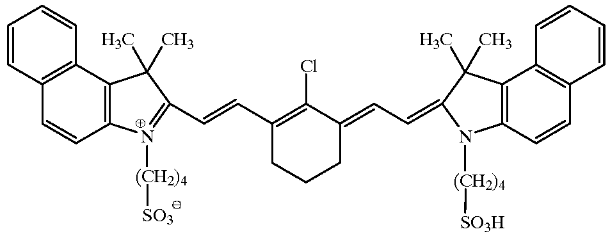

(I-32)

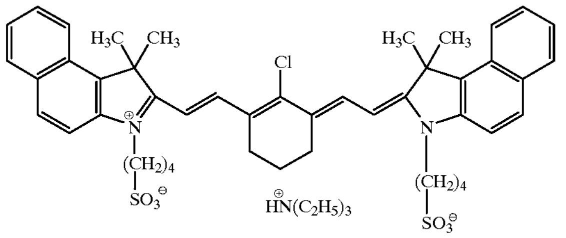

(I-33)

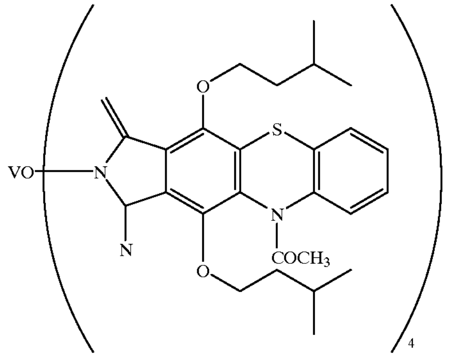

The light-to-heat converting particulate metal will be further described hereinafter. Most particulate metals are capable of converting light to heat and self-heat generating.

Preferred examples of particulate metal employable herein include particles of Si, Al, Ti, V, Cr, Mn, Fe, Co, Ni, Cu, Zn, Y, Zr, Mo, Ag, Au, Pt, Pd, Rh, In, Sn, W, Te, Pb, Ge, Re, Sb, alloy thereof, oxide thereof, and sulfide thereof.

Preferred among metals constituting these particulate metals are metals having a melting point of not higher than 1,000° C. which can be easily heat-fused when irradiated with light and have absorption in the infrared, visible or ultraviolet range, such as Re, Sb, Te, Au, Ag, Cu, Ge, Pb and Sn.

Particularly preferred among these metals are metals which have a relatively low melting point and relatively high absorbance of heat radiation, such as Ag, Au, Cu, Sb, Ge and Pb. Preferred among these metals are Ag, Au and Cu.

The light-to-heat converting particulate metal may be composed of two or more light-to-heat converting materials. For example, a particulate low melting metal such as Re, Sb, Te, Au, Ag, Cu, Ge, Pb and Sn and a particulate self-heat generating metal such as Ti, Cr, Fe, Co, Ni, W and Ge may be used in admixture. It is also preferred that minute pieces of a metal which exhibits a particularly high light absorbance in the form of minute pieces and minute pieces of other metals be used in combination.

The foregoing particulate metals, singly or in alloy form, can exert the effect of the invention more effectively when subjected to hydrophilic surface treatment. The hydrophilic surface treatment can be accomplished by a method involving the surface treatment of the particulate metal with a hydrophilic compound having adsorptivity to particles such as surface active agent, method involving the surface treatment of the particulate metal with a material having a hydrophilic group reactive with the constituents of the particulate metal or a method involving the provision of a protective colloidal hydrophilic polymer film on the particulate metal. In particular, the surface treatment with silicate is preferred. For example, particulate iron can be dipped in a 70° C. 3% aqueous solution of sodium silicate for 30 seconds so that the surface thereof is thoroughly hydrophilicized. Other particulate metals can be subjected to surface treatment with silicate in the same manner as mentioned above.

The diameter of these particulate metals is not greater than 10 $\mu$m, preferably from 0.003 to 5 $\mu$m, more preferably from 0.01 to 3 $\mu$m. The smaller the diameter of the particulate metal is, the lower is the heat fusion temperature thereof, i.e., the higher is the heat mode light sensitivity to advantage. However, the smaller the diameter of the particulate metal is, the more difficultly can be dispersed the particulate metal. On the contrary, when the diameter of the particulate metal exceeds 10 $\mu$m, the resulting printed matter exhibits a deteriorated resolution.

In the invention, the added amount of the light-to-heat converting material, if any, is not lower than 1% by weight, preferably not lower than 2% by weight, particularly not lower than 5% by weight based on the total solid content in the overcoat layer. When the content of the light-to-heat converting material falls below 1% by weight, the resulting lithographic printing plate precursor exhibits a lowered sensitivity.

[Support]

As the hydrophilic support to which the heat-sensitive layer can be applied to prepare the lithographic printing plate precursor of the invention there may be used a dimensionally stable tabular material. Examples of such a dimensionally stable tabular material include paper, paper laminated with plastic (e.g., polyethylene, polypropylene, polystyrene), metal plate (e.g., aluminum, zinc, copper), plastic film (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal), and paper or plastic having the foregoing metal laminated or vacuum-evaporated thereon. Preferred among these supports are polyether film and aluminum plate.

As the support to be used in the lithographic printing plate precursor of the invention there may be preferably used an aluminum plate, which has a light weight and is excellent in surface-treatability, workability and corrosion resistance. Examples of the aluminum material for this purpose include JIS 1050 material, JIS 1100 material, JIS 1070 material, Al—Mg alloy, Al—Mn alloy, Al—Mn—Mg alloy, Al—Zr alloy, and Al—Mg—Si alloy.

Examples of known techniques concerning the aluminum material which can be used as support will be given below.

(1) The following techniques are disclosed concerning JIS 1050 material.

JP-A-59-153861, JP-A-61-51395, JP-A-62-146694, JP-A-60-215725, JP-A-60-215726, JP-A-60-215727, JP-A-60-215728, JP-A-61-272357, JP-A-58-11759, JP-A-58-42493, JP-A-58-221254, JP-A-62-148295, JP-A-4-254545, JP-A-4-165041, JP-B-3-68939, JP-A-3-234594, JP-B-1-47545, JP-A-62-140894, etc. JP-B-1-35910, and JP-B-55-28874 are also known.

(2) The following techniques are disclosed concerning JIS 1070 material.

JP-A-7-81264, JP-A-7-305133, JP-A-8-49034, JP-A-8-73974, JP-A-8-108659, JP-A-8-92679, etc.

(3) The following techniques are disclosed concerning Al—Mg alloy.

JP-B-62-5080, JP-B-63-60823, JP-B-3-61753, JP-A-60-203496, JP-A-60-203497, JP-B-3-11635, JP-A-61-274993, JP-A-62-23794, JP-A-63-47347, JP-A-63-47348, JP-A-63-47349, JP-A-64-61293, JP-A-63-135294, JP-A-63-87288, JP-B-4-73392, JP-B-7-100844, JP-A-62-149856, JP-B-4-73394, JP-A-62-181191, JP-B-5-76530, JP-A-63-30294, JP-B-6-37116, etc. JP-A-2-215599, JP-A-61-201747, etc. are also known.

(4) The following techniques are disclosed concerning Al—Mn alloy.

JP-A-60-230951, JP-A-1-306288, JP-A-2-293189, etc. JP-B-54-42284, JP-B-4-19290, JP-B-4-19291, JP-B-4-19292, JF-B-61-35995, JP-A-64-51992, U.S. Pat. Nos. 5,009,722 and 5,028,276, JP-A-4-226394, etc. are also known.

(5) The following techniques are disclosed concerning Al—Mn—Mg alloy.

JP-A-62-86143, JP-A-3-222796, JP-B-63-60824, JP-A-60-63346, JP-A-60-63347, EP223737, JP-A-1-283350, U.S. Pat. No. 4,818,300, BR122777, etc. are also known.

(6) The following techniques are disclosed concerning Al—Zr alloy.

JP-B-63-15978, JP-A-61-51395, JP-A-63-143234, JP-A-63-143235, etc. are known.

(7) BR142710, etc. is known concerning Al—Mg—Si alloy.

As the method for preparing an aluminum plate as a support there may be used the following method.

A molten aluminum alloy having the foregoing components in the foregoing proportion is subjected to cleaning in ordinary manner, and then forged. For the cleaning treatment, fluxing, degassing with Ar gas, Cl gas or the like, filtration through a rigid media filter such as ceramic foam filter, a filter comprising a filtering material such as alumina flake and alumina ball or glass cloth filter or combination of degassing and filtration is effected to remove unnecessary gases such as hydrogen from the molten aluminum alloy. The cleaning treatment is preferably effected to prevent the occurrence of defects due to foreign matters such as non-metallic inclusions and oxides in the molten aluminum alloy or gases dissolved in the molten aluminum alloy.

As techniques concerning the filtration of the molten aluminum alloy there are known JP-A-6-57342, JP-A-3-162530, JP-A-5-140659, JP-A-4-231425, JP-A-4-276031, JP-A-5-311261, JP-A-6-136466, etc.

As techniques concerning the degassing of the molten aluminum alloy there are known JP-A-5-51659, JP-A-5-51660, JP-A-5-276031U (The term "JP-A" as used herein means an "unexamined published Japanese utility model"), JP-A-7-40017, etc.

As mentioned above, the molten aluminum alloy which has been subjected to cleaning is casted. Examples of casting method employable herein include a casting method using a fixed casting mold such as DC casting and a casting method using a driven casting mold such as continuous casting.

In the case where DC casting is used, solidification is effected at a cooling rate of from 1 to 300° C./sec. When the cooling rate falls below 1° C./sec, many coarse intermetallic compounds are produced.

For continuous casting, a method using a cooling roll such as hunter method and 3C method, Husley method, and a method using a cooling belt such as alusuisse caster II type cooling belt or cooling block are conducted on an industrial basis. In the case where continuous casting method is used, solidification is effected at a cooling rate of from 100 to 1,000° C./sec. In general, continuous casting is conducted at a higher cooling rate than DC casting. Thus, continuous casting allows the enhancement of the degree of solid-solution of alloying components with respect to aluminum matrix. As techniques concerning continuous casting, JP-A-3-79798, JP-A-5-201166, JP-A-5-156414, JP-A-6-262203, JP-A-6-122949, JP-A-6-210406, JP-A-6-262308, etc. are disclosed by the inventors.

In the case where DC casting is effected, a tabular ingot having a thickness of from 300 to 800 mm can be produced. The ingot is then planed in an ordinary manner so that it is cut on the surface layer to a depth of from 1 to 30 mm, preferably from 1 to 10 mm. Thereafter, as necessary, the ingot is subjected to soaking. For soaking, heat treatment is effected at a temperature of from 450° C. to 620° C. for 1 to 48 hours so that the intermetallic compound cannot grow in size. When the heat treatment is effected for less than 1 hour, the soaking effect is insufficient. Subsequently, the ingot is subjected to hot rolling and cold rolling to obtain a rolled aluminum plate. The temperature at which hot rolling begins is from 350° C. to 500° C. An intermediate annealing may be effected before, after or during cold rolling. The intermediate annealing can be accomplished by a method which comprises heating the ingot to a temperature of from 280° C. to 600° C. for 2 to 20 hours, preferably at a temperature of 350° C. to 500° C. for 2 to 10 hours in a batchwise annealing furnace or a method which comprises subjecting the ingot to heat treatment at a temperature of from 400° C. to 600° C. for 360 seconds or less, preferably at a temperature of from 450° C. to 550° C. for 120 seconds or less in a continuous annealing furnace. When heating is effected at a rate of not lower than 10° C./sec in a continuous annealing furnace, finer crystalline structures can be provided.

The aluminum plate which has thus been finished to a predetermined thickness of from 0.1 to 0.5 mm may be passed through a correcting device such as roller leveler and tension leveler to improve the flatness thereof. The improvement of flatness may be effected on the aluminum plate which has been cut into sheet. However, in order to improve productivity, the improvement of flatness is preferably effected on the aluminum plate in the form of continuous coil. In order to work the aluminum plate into a predetermined width, it is normally practiced to pass the aluminum plate through a slitter line. The edge face of the aluminum plate which has appeared after cutting by the slitter has either or both of shear plane and rupture cross-section.

The precision of thickness of the aluminum plate is within ±10 μm, preferably within ±6 μm throughout the entire length of the coil. The crosswise deviation of thickness is 6 μm or less, preferably 3 μm or less. The precision of width of the aluminum plate is within ±1.0 μm, preferably within ±0.5 μm. The surface roughness of the aluminum plate can be subject to the effect of the surface roughness of the pressure roll. However, it is preferred that the aluminum plate be finished to a central line surface roughness (Ra) of from about 0.1 to 1.0 μm. When Ra is too great, the aluminum plate which has been subjected to roughening and application of heat-sensitive layer for lithographic printing plate can be observed through the heat-sensitive layer to have original roughness, i.e., rolling streaks transferred from the pressure roll to disadvantage from the standpoint of external appearance. In order to obtain a surface roughness Ra of not higher than 0.1 μm, it is necessary that finish the surface of the pressure roll to an excessively low roughness to disadvantage on an industrial basis.

In order to prevent the occurrence of mark due to friction of aluminum plates with each other, a thin oil film may be provided on the surface of the aluminum plate. As the oil film there may be properly used a volatile or nonvolatile oil as necessary. When the amount of the oil is too great, slippage can occur in the production line. On the contrary, when the amount of the oil is none, marks are developed during the transportation of the coil to disadvantage. Accordingly, the amount of the oil is preferably from not lower than 3 $mg/m^2$ to not higher than 100 $mg/m^2$. The upper limit of the amount of the oil is preferably 50 $mg/m^2$, more preferably 10 $mg/m^2$. As techniques concerning cold rolling there are disclosed JP-A-6-210308, etc.

In the case where continuous casting is effected, when the cooling roll as in Hunter method is used, a casted plate having a thickness of from 1 to 10 mm can be directly produced through continuous casting and rolling process, making it possible to omit a step of hot rolling. Further, when the cooling roll as in Husley method is used, a casted plate having a thickness of from 10 to 50 mm can be produced. In general, by providing a hot pressure roll shortly after casting so that continuous rolling is allowed, a continuous casted rolled plate having a thickness of from 1 to 10 mm can be obtained. The continuous casted rolled plate thus obtained is then passed through steps of cold rolling, intermediate annealing, improving flatness, slitting, etc. in the same manner as mentioned with reference to DC casting to obtain a finished plate having a thickness of from 0.1 to 0.5 mm. For the conditions of intermediate annealing and cold rolling under which continuous casting is effected, reference can be made to JP-A-6-220593, JP-A-6-210308, JP-A-7-54111, JP-A-8-92709, etc.

The aluminum plate thus produced can be subjected to surface treatment such as roughening, and then coated with a heat-sensitive layer to obtain a lithographic printing plate precursor. Roughening can be accomplished by mechanical roughening, chemical roughening or electrochemical roughening, singly or in combination. Further, anodization may be preferably effected to make the surface of the aluminum plate less scratchable. Alternatively, a proper treatment may be preferably effected to make the surface of the aluminum plate more hydrophilic.

The surface treatment of the support will be further described hereinafter.

Prior to roughening, the aluminum plate may be subjected to degreasing with a surface active agent, an organic solvent or an alkaline aqueous solution to remove the rolling oil from the surface thereof as necessary. In the case where degreasing is effected with an alkaline aqueous solution, neutralization with an acidic solution or removal of smut may follow.

Subsequently, the support is subjected to surface roughening, i.e., so-called graining for the purpose of improving the adhesivity between the support and the heat-sensitive layer and rendering the non-image area capable of retaining water. Specific examples of graining methods include mechanical graining methods such as sand blasting, ball graining, wire graining, brush graining with nylon brush and an abrasive/water slurry and honing graining involving the blowing of an abrasive/water slurry on the surface of support at a high pressure, and chemical graining methods involving surface roughening with an etching agent made of an alkali or an acid or a mixture thereof. Other known graining methods include electrochemical graining methods disclosed in British Patent 896,563, JP-A-53-67507, JP-A-54-146234, and JP-B-53-123204, combination of mechanical graining method and electrochemical graining method disclosed in JP-A-53-123204 and JP-A-54-63902, and combination of mechanical graining method and chemical graining method with a saturated aqueous solution of aluminum salt of mineral acid disclosed in JP-A-56-55261. Further examples of graining methods include a method which comprises bonding a granular material to the foregoing support with an adhesive or by the same effect to roughen the surface thereof, and a method which comprises pressing a continuous body or roll having a fine roughness against the support material so that the roughness is transferred to the surface of the support to roughen the surface of the support.

A plurality of these roughening methods may be effected in combination. The order of these methods and the number of repetition of these methods may be arbitrarily determined. In the case where a plurality of roughening methods are effected in combination, a chemical treatment with an acid or alkali may be effected between the roughening steps to effect the subsequent roughening step uniformly. Specific examples of the foregoing acid or alkali include acids such as fluoric acid, fluorozirconic acid, phosphoric acid, sulfuric acid, hydrochloric acid and nitric acid, and an aqueous solution of alkali such as sodium hydroxide, sodium silicate and sodium carbonate. These acids or alkaline aqueous solutions may be used singly or in admixture of two or more thereof. The chemical treatment is normally effected with an aqueous solution of such an acid or alkali having a concentration of from 0.05 to 40% by weight at a liquid temperature of from 40° C. to 100° C. for 5 to 300 seconds.

Smut has been produced on the surface of the support obtained by the foregoing roughening or graining. In order to remove smut, it is normally preferred that the support be properly subjected to treatment such as rinsing and alkali etching. Examples of such a treatment include alkali etching method disclosed in JP-B-48-28123, and sulfuric acid desmutting method disclosed in JP-A-53-12739.

The aluminum support to be used in the invention is subjected to the foregoing pre-treatment, and then normally subjected to anodization to form an anodized layer thereon for the purpose of improving abrasion resistance, chemical resistance and water retention thereof.

As the electrolyte for use in the anodization of the aluminum plate there may be used any electrolyte which can form a porous anodized layer. In general, sulfuric acid, phosphoric acid, oxalic acid, chromic acid or mixture thereof may be used. The concentration of the electrolyte is properly determined depending on the kind of the electrolyte. The anodization conditions vary with the electrolyte used and thus cannot be unequivocally determined. In general, the concentration of the electrolyte is preferably from 1 to 80%, the liquid temperature is preferably from 5° C. to 70° C., the current density is preferably from 5 to 60 $A/dm^2$, the voltage is preferably from 1 to 100 V, and the electrolysis time is preferably from 10 seconds to 5 minutes. The amount of the anodized layer is preferably not lower than 1.0 $g/m^2$, more preferably from 2.0 to 6.0 $g/m^2$. When the amount of the anodized layer falls below 1.0 $g/m^2$, the resulting lithographic printing plate precursor exhibits an insufficient impression capacity. Further, the image area on the resulting lithographic printing plate can be easily scratched, causing so-called “scratch stain”, which involves the attachment of ink to scratched area during printing.

The anodization is effected on the surface of the support of the lithographic printing plate which is used for printing. However, it is usual that an anodized layer is formed also on the other surface to a thickness of from 0.01 to 3 $g/m^2$ because the electric force lines reach the other surface. Alternatively, anodization in an alkaline aqueous solution or molten salt or an anodization involving the formation of a nonporous anodized layer using an aqueous solution of ammonium borate may be effected.

The anodization may be preceded by the formation of a hydrous oxide film as disclosed in JP-A-4-148991, and JP-A-4-97896, treatment in a metal silicate solution or formation of a hydrous oxide film as disclosed in JP-A-63-56497 and JP-A-63-67295 or the formation of chemically formed film as disclosed in JP-A-56-144195.

The anodized aluminum support to be used in the lithographic printing plate precursor of the invention may be treated with an organic acid or salt thereof or may comprise such an organic acid or salt thereof provided thereon as a subbing layer for heat-sensitive layer. Examples of the organic acid or salt thereof include organic carboxylic acid, organic phosphonic acid, organic sulfonic acid, and salt thereof. Preferred among these organic acids or salt thereof is organic carboxylic acid or salt thereof. Examples of the organic carboxylic acid employable herein include aliphatic monocarboxylic acids such as formic acid, acetic acid, propionic acid, butyric acid, lauric acid, palmitic acid and stearic acid, unsaturated aliphatic monocarboxylic acids such as oleic acid and linoleic acid, aliphatic dicarboxylic acids such as oxalic acid, succinic acid, adipic acid and maleic acid, oxycarboxylic acids such as lactic acid, gluconic acid, malic acid, tartaric acid and citric acid, aromatic carboxylic acids such as benzoic acid, mandelic acid, salicylic acid and phthalic acid, and salt of these acids with metals belonging to the groups Ia, IIb, IIIb, IVa, VIb and VIII or ammonium. Preferred among the foregoing organic acid salts are salts of formic acid, acetic acid, butyric acid, propionic acid, lauric acid, oleic acid, succinic acid and benzoic acid with the foregoing metals or ammonium. These compounds may be used singly or in combination of two or more thereof.

These compounds are preferably dissolved in water or an alcohol in such an arrangement that the concentration reaches a range of from 0.001 to 10% by weight, particularly from 0.01 to 1.0% by weight. Referring to the treatment conditions, the aluminum support is dipped in the electrolyte at a temperature of from 25° C. to 95° C., preferably from 50° C. to 95° C., and a pH value of from 1 to 13 for 2 to 10 minutes, preferably 10 seconds to 20 minutes, more preferably 10 seconds to 3 minutes, or coated with the electrolyte.

The aluminum support which has been anodized may be treated with the following compound solution or may comprise such a compound provided thereon as a subbing layer for heat-sensitive layer. Examples of the compound which can be preferably used include organic phosphonic acids such as phenylphosphonic acid, naphthylphosphonic acid. alkylphosphonic acid, glycerophosphonic acid, methylenediphosphonic acid and ethylenediphosphonic acid which may have substituents, organic phosphoric acids such as phenylphosphonic acid, naphthylphosphoric acid, alkylphosphoric acid and glycerophosphoric acid which may have substituents, organic phosphinic acids such as phenylphosphinic acid, naphthylphosphinic acid, alkylphosphinic acid and glycerophosphinic acid which may have substituents, glycine, β-alanine, valine, serine, threonine, aspartic acid, glutamic acid, arginine, lysine, tryptophane, parahydroxypheynyl glycine, dihydroxyethyl glycine and anthranyl, aminosulfonic acids such as sulfamic acid and cyclohexylsulfamic acid, and aminophosphonic acids such as 1-aminomethylphosphonic acid, 1-dimethylaminoethylphosphonic acid, 2-aminoethylphosphonic acid, 2-aminopropylphosphonic acid, 4-aminophenylphosphonic acid, 1-aminoethane-1,1-diphosphonic acid, 1-amino-1-phenylmethane-1,1-diphosphonic acid, 1-dimethylaminoethane-1,1-diphosphonic acid, 1-dimethylaminobutane-1,1-diphosphonic acid and ethylenediaminetetramethylenephosphonic acid.

Alternatively, salts of hydrochloric acid, sulfuric acid, nitric acid, sulfonic acid (methanesulfonic acid, etc.) or oxalic acid with an alkaline metal, ammonia, lower alkanolamine (triethanolamine, etc.), lower alkylamine (triethylamine, etc.) or the like may be preferably used.

Other examples of the compound which can be preferably used in the invention include water-soluble polymers such as polyacrylamide, polyvinyl alcohol, polyvinyl pyrrolidone, polyethyleneimine and acid thereof with mineral acid, poly (meth)acrylic acid and salt thereof with metal, polystyrenesulfonic acid and salt thereof with metal, (meth)acrylic acid alkylester, 2-acrylamide-2-methyl-1-propanesulfonic acid and salt thereof with metal, polymer and copolymer of chlorinated trialkylammonium methyl styrene with (meth) acrylic acid and polyvinyl phosphonic acid.

Further examples of the compound which can be preferably used in the invention include soluble starch, carboxymethyl cellulose, dextrin, hydroxyethyl cellulose, gum arabic, guar gum, sodium alginate, gelatin, glucose, and sorbitol. These compounds may be used singly or in combination of two or more thereof.

In the case where the foregoing compound is used for treatment, the compound is preferably dissolved in water and/or methyl alcohol in an amount such that the concentration reaches 0.001 to 10% by weight, particularly 0.01 to 1.0% by weight. Referring to the treatment conditions, the aluminum support is dipped in the solution at a temperature of from 25° C. to 95° C., preferably from 50° C. to 95° C., and a pH value of from 1 to 13, preferably from 2 to 10 for 10 seconds to 20 minutes, preferably 10 seconds to 3 minutes.

In the case where the foregoing compound is used as a subbing layer for heat-sensitive layer, the compound is dissolved in water and/or methyl alcohol in an amount such that the concentration reaches 0.001 to 10% by weight, particularly 0.01 to 1.0% by weight in the same manner as mentioned above. The solution may be adjusted for pH with a basic material such as ammonia, triethylamine and potassium hydroxide or an acidic material such as hydrochloric acid and phosphoric acid. In this manner, the solution can be used at a pH value of from 1 to 12. Further, the solution may comprise a yellow dye incorporated therein to improve the tone reproducibility of the lithographic printing plate precursor. The dried coated amount of the organic subbing layer is preferably from 2 to 200 mg/$m^2$, more preferably from 5 to 100 mg/$m^2$. When the coated amount of the subbing layer falls below 2 mg/$M^2$, the resulting effect cannot be exerted sufficiently for original purposes such as preventing stain. On the contrary, when the coated amount of the subbing layer exceeds 200 mg/$m^{2,}$ the resulting impression capacity is deteriorated.

An interlayer for enhancing the adhesivity between the support and the heat-sensitive layer may be provided. In order to enhance the adhesivity between the support and the heat-sensitive layer, the interlayer is normally made of a diazo resin or a phosphoric acid compound having aluminum to which it is adsorbed. The thickness of the interlayer is arbitrary such that the interlayer can undergo uniform bond-forming reaction with the upper heat-sensitive layer when exposed to light. In general, the coated amount of the interlayer is preferably from 1 to 100 mg/$m^2$, particularly from 5 to 40 mg/$m^2$ as calculated in terms of dried solid content. The proportion of the diazo resin in the interlayer is from 30% to 100%, preferably from 60% to 100%.

Prior to the foregoing treatment or provision of subbing layer, the support which has been anodized may be subjected to rinsing followed by the following treatments for the purpose of inhibiting the dissolution of anodized layer in the developer or fountain solution and the remaining of heat-sensitive layer components and improving the strength and hydrophilicity of anodized layer and the adhesivity thereof to the heat-sensitive layer.

One of the treatments is silicate treatment involving the treatment of anodized layer with an aqueous solution of silicate of alkaline metal. In accordance with this silicate treatment, the aluminum support is brought into contact with an aqueous solution having an alkaline metal silicate concentration of from 0.1 to 30% by weight, preferably from 0.5 to 15% by weight, and a 25° C. pH value of from 10 to 13.5 at a temperature of from 5° C. to 80° C., preferably from 10° C. to 70° C., more preferably from 15° C. to 50° C. for 0.5 to 120 seconds. The contact of the aluminum support with the aqueous solution can be accomplished by dipping, spraying or any other methods. The aqueous solution of silicate of alkaline metal undergoes gelation when its pH value is lower than 10 and is subject to dissolution of anodized layer when its pH value is higher than 13.5.

Examples of the silicate of alkaline metal employable herein include sodium silicate, potassium silicate, and lithium silicate. Examples of hydroxides to be used in the adjustment of pH value of the aqueous solution of silicate of alkaline metal include sodium hydroxide, potassium hydroxide, and lithium hydroxide. The foregoing treatment may comprise an alkaline earth metal salt or a salt of metal belonging to the group IVb incorporated therein. Examples of the alkaline earth metal salt employable herein include nitrates such as calcium nitrate, strontium nitrate, magnesium nitrate and barium nitrate, sulfates, hydrochlorides, phosphates, acetates, oxalates, and borates. Examples of the salt of metal belonging to the group IVb employable herein include titanium tetrachloride, titanium trichloride, titanium potassium fluoride, titanium potassium oxalate, titanium sulfate, titanium tetraiodide, and zirconium chloride oxide. These alkaline earth metal salts or salts of metal belonging to the group IVb may be used singly or in combination of two or more thereof. The amount of these metal salts to be used is preferably from 0.01 to 10% by weight, more preferably from 0.05 to 5.0% by weight.

Other methods are various sealing treatments. As these sealing treatments there may be normally used sealing with water vapor, sealing with boiling water (hot water), sealing with metal salt (e.g., sealing with chromate/bichromate, sealing with nickel acetate), sealing with oil and fat, sealing with synthetic resin and low temperature sealing (with red prussiate or alkaline earth salt), which are known as methods for sealing the pores in the anodized layer. From the standpoint of properties of support for printing plate (adhesivity to heat-sensitive layer, hydrophilicity), high speed processing, reduction of cost and environmental protection, sealing with water vapor is relatively desirable. An example of sealing with water vapor is a method which comprises allowing water vapor to come in continuous or discontinuous contact with the anodized layer at a relative humidity of not lower than 70%, a vapor temperature of not lower than 95° C. under pressure or atmospheric pressure for 2 seconds to 180 seconds as disclosed in JP-A-4-176690. Another example of sealing is a method involving the dipping of the support in a hot water or alkaline aqueous solution having a temperature of from 80° C. to 100° C. or spraying such a hot water or alkaline aqueous solution onto the support which is replaced or followed by the dipping in a nitrous acid solution or spraying with a nitrous acid solution. Examples of the nitrite employable herein include nitrate of metal belonging to the group Ia, IIa, IIb, IIIb, IVb, IVa, VIa, VIIIa and VIII, and ammonium salt, i.e., ammonium nitrite. Examples of these metal salts include $LiO_2$, $NaNO_2$, $KNO_2$, $Mg(NO_2)_2$, $Ca(NO_2)_2$, $Zn(NO_3)_2$, $Al(NO_2)_3$, $Zr(NO_2)_4$, $Sn(NO_2)_3$, $Cr(NO_2)_3$, $Co(NO_2)_2$, $Mn(NO_2)_2$, and $Ni(NO_2)_2$. Particularly preferred among these metal salts are nitrite of alkaline metals. Two or more of these nitrites may be used in combination.

The treatment conditions vary with the conditions of the support and the kind of the alkaline metal used and thus cannot be unequivocally determined. In practice, however, if sodium nitrite is used, the concentration of the treatment is from 0.001 to 10% by weight, preferably from 0.01 to 2% by weight, the bath temperature is preferably from room temperature to about 100° C., more preferably from 60° C. to 90° C., and the processing time is preferably from 15 seconds to 300 seconds, more preferably from 10 seconds to 180 seconds. The pH value of the aqueous solution of nitrous acid is preferably adjusted to a range of from 8.0 to 11.0, more preferably from 8.5 to 9.5. The adjustment of the pH value of the aqueous solution of nitrous acid can be preferably accomplished by the use of an alkaline buffer or the like. The alkaline buffer to be used herein is not limited. In practice, however, a mixed aqueous solution of sodium hydrogencarbonate and sodium hydroxide, a mixed aqueous solution of sodium carbonate and sodium hydroxide, a mixed aqueous solution of sodium carbonate and sodium hydrogencarbonate, a mixed aqueous solution of sodium chloride and sodium hydroxide, a mixed aqueous solution of hydrochloric acid and sodium carbonate, a mixed aqueous solution of sodium tetraborate and sodium hydroxide, or the like are preferably used. The foregoing alkaline buffer may be in the form of salt with alkaline metal other than sodium, such as potassium salt.

The aluminum support which has been subjected to silicate treatment or sealing may then be subjected to treatment with an acidic aqueous solution and coating with a hydrophilic subbing layer as disclosed in JP-A-5-278362 or formation of an organic layer as disclosed in JP-A-4-282637 and JP-A-7-314937.

A back coat is then provided on the surface of the support opposite the surface thereof which has been thus treated or coated with a subbing layer as necessary. As the back coat there is preferably used a coat layer made of an organic polymer disclosed in JP-A-5-45885 or a metal oxide obtained by the hydrolysis and polycondensation of or an organic or inorganic metal compound disclosed in JP-A-6-35174. Particularly preferred among these coat layer materials are silicon alkoxy compounds such as $Si(OCH_3)_4$, $Si(OC_2H_5)_4$, $Si(OC_3H_7)_4$ and $Si(OC_4H_9)_4$, which are easily available and can provide a coat layer of metal oxide having an excellent developer resistance.

The support for lithographic printing plate preferably has a central line average roughness of from 0.10 to 1.2 $\mu$m. When the central line average roughness of the support falls below 0.10 $\mu$m, the resulting support exhibits a deteriorated adhesivity to heat-sensitive layer, causing a drastic deterioration of impression capacity. On the contrary, when the central line average roughness of the support exceeds 1.2 $\mu$m, the resulting support exhibits worse stain resistance during printing. The color density of the support is from 0.15 to 0.65 as calculated in terms of reflection density. When the color density of the support is lower than 0.15 (whiter than above), the resulting lithographic printing plate undergoes too strong a halation during imagewise exposure, hindering image formation. On the contrary, when the color density of the support is higher than 0.65 (blacker than above), images developed can hardly be appreciated during inspection. Thus, the printing plate has a deteriorated inspectability.

The lithographic printing plate precursor of the invention can comprise as a support an aluminum substrate which has been roughened and anodized to provide a better on-the-machine developability. As such an aluminum substrate there is preferably used one which has been further subjected to silicate treatment.

The printing plate of the invention may comprise a water-insoluble hydrophilic layer or a water-insoluble hydrophilic layer which generates heat when exposed to laser beam provided on the aluminum substrate optionally with a heat insulating barrier made of an organic polymer being provided interposed therebetween for rendering the aluminum substrate heat-insulating.

For example, a hydrophilic layer made of a particulate silica and a hydrophilic resin may be provided on the aluminum substrate. Further, the hydrophilic layer may comprise the foregoing light-to-heat converting material incorporated therein to form a heat-generating hydrophilic layer. This arrangement not only makes it difficult for heat to escape to the aluminum substrate but also makes it possible to use the aluminum substrate as a hydrophilic substrate which generates heat when exposed to laser beam. Further, the provision of an interlayer made of an organic polymer interposed between the hydrophilic layer and the aluminum substrate makes it possible to further prevent heat from escaping to the aluminum substrate. Preferably, the support is not porous from the standpoint of on-the-machine developability. A support which comprises such a hydrophilic organic polymer material in an amount of not lower than 40% and thus can swell with water can hardly allow ink to be wiped off.

The hydrophilic layer to be used in the invention has preferably been three-dimensionally crosslinked. This hydrophilic layer preferably is a layer which is insoluble in the fountain solution during lithographic printing with water and/or ink. Thus, this hydrophilic layer preferably comprises a colloid made of a sol-gel conversion material of oxide or hydroxide of beryllium, magnesium, aluminum, silicon, titanium, boron, germanium, tin, zirconium, iron, vanadium, antimony or transition metal. The colloid may comprise a composite of these elements as necessary. The colloid has a network structure formed by these elements with oxygen atom interposed therebetween. The colloid also has hydroxyl groups or alkoxy groups unbonded thereto. Thus, the colloid has these structures in admixture. In the initial stage of hydrolytic condensation, the colloid contains many active alkoxy groups or hydroxyl groups. As the reaction proceeds, the colloid grows in particle diameter and becomes inactive. The particle diameter of the colloid is normally from 2 nm to 500 nm. In the present invention, the colloid, if it is made of silica, preferably comprises spherical particles having a diameter of from 5 nm to 100 nm. A colloid comprising fluffy particles having a size of 100 nm×10 nm like aluminum colloid is useful, too.

A pearl necklace-shaped colloid having a chain of spherical particles having a size of from 10 nm to 50 nm in the length of from 50 nm to 400 nm may be used.

The colloid may be used singly or in admixture with a hydrophilic resin. In order to accelerate crosslinking, the colloid may comprise a crosslinking agent incorporated therein.

In general, the colloid often stays stabilized with a stabilizer. A colloid charged with cation comprises an anion-containing compound incorporated therein. On the contrary, a colloid charged with anion comprises a cation-containing compound incorporated therein. For example, a silicon colloid is charged with anion and thus comprises an amine-based compound incorporated therein as a stabilizer. An aluminum colloid is charged with cation and thus comprises a strong acid such as hydrochloric acid and acetic acid incorporated therein as a stabilizer. Most of these colloids form a normally transparent film when applied to a substrate. However, the film thus formed undergoes insufficient gelation even when the solvent evaporates. The film can undergo thorough three-dimensional crosslinking to form a hydrophilic layer suitable for the invention only when heated to a temperature at which the stabilizer can be removed.

Instead of using the foregoing stabilizer, a starting material (e.g., dialkoxysilane, trialkoxysilane and/or tetraalkoxysilane) may be directly allowed to undergo hydrolytic condensation reaction to form a proper sol which is then applied to the substrate on which it is then dried to finish the reaction. In this manner, three-dimensional crosslinking can occur at a lower temperature than using a stabilizer.

Alternatively, a colloid having a proper hydrolytic condensation reaction product dispersed and stabilized in an organic solvent is desirable in the invention. In order to obtain a three-dimensionally crosslinked film, it is only necessary that the solvent evaporate. As such a solvent there can be used a low boiling solvent selected from the group consisting of methanol, ethanol, propanol, butanol, ethylene glycol monomethyl ether, ethylene glycol monoethyl ether and methyl ethyl ketone, allowing the colloid to dry at ordinary temperature. In the invention, a colloid comprising methanol or ethanol as a solvent can easily harden at low temperatures and thus is useful in particular.

As the hydrophilic resin to be used with the foregoing colloid there is preferably used one having a hydrophilic group such as hydroxyl, carboxyl, hydroxyethyl, hydroxypropyl, amino, aminoethyl, aminopropyl and carboxymethyl. Specific examples of the hydrophilic resin employable herein include gum arabic, casein, gelatin, starch derivative, carboxymethyl cellulose and sodium salt thereof, cellulose acetate, sodium alginate, vinyl acetate-maleic acid copolymer, styrene-maleic acid copolymer, polyacrylic acid and salt thereof, polymethacrylic acid and salt thereof, hompolymer and copolymer of hydroxyethyl methacrylate, homopolymer and copolymer of hydroxyethyl acrylate, homopolymer and copolymer of hydroxypropyl methacrylate, homopolymer and copolymer of hydroxypropyl acrylate, homopolymer and copolymer of hydroxybutyl acrylate, polyethylene glycol, hydroxypropylene polymer, polyvinyl alcohol, hydrolyzed polyvinyl acetate having a hydrolyzation degree of at least 60% by weight, preferably at least 80% by weight, polyvinyl formal, polyvinyl butyral, polyvinyl pyrrolidone, homopolymer and copolymer of acrylamide, homopolymer and copolymer of methacrylamide, homopolymer and copolymer of N-methylol acrylamide, and 2-acrylamide-2-methylpropanesulfonic acid and homopolymer and copolymer of salt thereof.

A particularly preferred hydrophilic resin is a hydroxyl-containing polymer which is not water-soluble. Specific examples of such a polymer include homopolymer and copolymer of hydroxyethyl methacryate, and copolymer of hydroxyethyl acrylate.

Such a hydrophilic resin is used with the colloid. The mixing proportion of the hydrophilic resin, if it is water-soluble, is preferably not higher than 40% by weight based on the total solid content in the hydrophilic layer. The mixing proportion of the hydrophilic resin which is not water-soluble is preferably not higher than 20% by weight based on the total solid content in the hydrophilic layer.

The foregoing hydrophilic resin can be used as it is. Alternatively, the hydrophilic resin may comprise a hydrophilic resin crosslinking agent other than colloid incorporated therein for the purpose of enhancing the impression capacity during printing. Examples of such a hydrophilic resin employable herein include initial hydrolytic condensate of formaldehyde, glyoxal, polyisocyanate and tetraalkoxysilane, dimethylurea, and hexamethylolmelamine.

The hydrophilic layer of the invention may comprise a crosslinking agent for accelerating the crosslinking of colloid incorporated therein besides the colloid of oxide or hydroxide and the hydrophilic resin. Preferred examples of such a crosslinking agent employable herein include initial hydrolytic condensate of tetraalkoxysilane, trialkoxysilylpropyl-N,N,N-trialkylammonium halide, and aminopropyltrialkoxysilane. The mixing proportion of the crosslinking agent is preferably not higher than 5% by weight based on the total solid content in the hydrophilic layer.

The hydrophilic layer of the invention may comprise a hydrophilic light-to-heat converting material incorporated therein to enhance the heat sensitivity thereof. A particularly preferred example of the light-to-heat converting material is a water-soluble infrared absorbing material. This water-soluble infrared absorbing material is a cyanine dye having a sulfonic acid group represented by the general formula (I) or a salt thereof with alkaline metal or amine. The mixing proportion of such a dye is preferably from 1 to 20% by weight, more preferably from 5 to 15% by weight based on the total amount of the hydrophilic layer.

The coated thickness of the three-dimensionally crosslinked hydrophilic layer of the invention is preferably from 0.1 μm to 10 μm, more preferably from 0.5 μm to 5 μm. When the thickness of the hydrophilic layer is too small, the resulting hydrophilic layer exhibits a deteriorated durability that worsens the impression capacity during printing. On the contrary, when the thickness of the hydrophilic layer is too great, the resulting lithographic printing plate precursor exhibits a deteriorated resolution.

The interlayer made of an organic polymer will be further described hereinafter. As the organic polymer to be used in the interlayer there may be used any organic polymer which is commonly used, e.g., polyurethane resin, polyester resin, acrylic resin, cresol resin, resol resin, polyvinyl acetal resin, vinyl resin, without any problem. The coated amount of such an organic polymer is preferably from 0.1 $g/m^2$ to 5.0 $g/m^2$. When the coated amount of the organic polymer falls below 0.1 $g/m^2$, the resulting insulating effect is insufficient. On the contrary, when the coated amount of the organic polymer exceeds 5.0 $g/m^2$, the non-image area exhibits a deteriorated impression capacity.

The lithographic printing plate precursor of the invention can form an image when exposed to laser beam at a high output. Alternatively, a writing device such as thermal head may be used. In the invention, it is particularly preferred that a laser which emits light in the infrared or near infrared region be used. A laser diode which emits light in the near infrared range is particularly preferred.

Recording using an ultraviolet lamp is allowed. In the invention, however, a solid laser or semiconductor laser which emits infrared rays having a wavelength of from 760 nm to 1,200 nm is preferably used to effect imagewise exposure. The output of the laser is preferably not lower than 100 mW. In order to reduce the exposure time, a multi-beam laser device is preferably used. The exposure time per pixel is preferably within 20 microseconds. The energy with which the recording material is irradiated is preferably from 10 to 300 $mJ/cm^2$.

The plate thus exposed is then mounted untreated on the cylinder of a printing machine. The plate thus mounted is then subjected to the following treatment for printing.

(1) A method which comprises supplying a fountain solution onto the printing plate, subjecting the printing plate to on-the-machine development, and then supplying an ink to the printing plate to begin printing. (2) A method which comprises supplying a fountain solution and an ink onto the printing plate, subjecting the printing plate to on-the-machine development, and then starting printing. (3) A method which comprises supplying an ink onto the printing plate, and then supplying a fountain solution onto the printing plate simultaneously with the supply of printing paper to begin printing.

As disclosed in Japanese Patent No. 2,938,398, the printing plate of the invention which has been mounted on the cylinder of a printing machine can be subjected to exposure to beam from a laser mounted on the printing machine followed by on-the-machine development with a fountain solution and/or ink, preferably water or aqueous solution. Alternatively, the printing plate of the invention can be mounted undeveloped on the printing machine for printing purpose.

EXAMPLE

The present invention will be further described in the following examples, but the present invention should not be construed as being limited thereto.

Example 1

[Synthesis of Thermoplastic Particulate Polymers (1) to (6)]

To 15 g of styrene was added 200 ml of an aqueous solution of polyoxyethylene nonyl phenol (concentration: $9.84\times10^{-3}$ mol/l). The air within the system was replaced by nitrogen gas while the mixture was being stirred at 250 rpm. The solution was then adjusted to a temperature of 25° C. To the solution was then added 10 ml of an aqueous solution of ammonium salt of cerium (IV) (concentration: $0.984\times10^{-3}$ mol/l). At this point, the solution was adjusted to a pH value of from 1.3 to 1.4 with an aqueous solution of ammonium nitrate (concentration: $58.8\times10^{-3}$ mol/l). The solution was then stirred for 8 hours. The solution thus obtained had a solid concentration of 9.0% and comprised a particulate polystyrene (PS) (1) having an average particle diameter of 0.4 μm.

The foregoing procedure of synthesis of particulate polymer (1) was followed except that styrene was replaced by 15 g of methyl methacrylate, butyl methacrylate and phenyl acrylate to prepare particulate polymethyl methacrylate (PMMA), particulate polybutyl methacrylate (PBMA) and particulate polyphenyl acrylate (PPA), respectively. Further, styrene was replaced by methyl acrylate and butyl acrylate, and the conditions of addition of particulate copolymers were changed to prepare particulate polymers having a particle diameter of 0.2 μm. Thus, particulate polymers (2) to (6) were prepared. The properties of these particulate polymers are set forth in Table 1.

TABLE 1

| Particulate polymer No. | Kind of polymer | Tg (° C.) | Particle diameter |
|---|---|---|---|
| (1) | PS | 100 | 0.4 μm |
| (2) | PMMA | 103 | 0.4 μm |
| (3) | PMMA/PBMA (28/72) | 62 | 0.4 μm |
| (4) | PS | 100 | 0.2 μm |
| (5) | PMMA | 103 | 0.2 μm |
| (6) | PPA | 57 | 0.4 μm |

[Synthesis of Particulate Polymer (a) Having Heat-reactive Functional Group]

7.5 g of allyl methacrylate, 7.5 g of butyl methacrylate and 200 ml of an aqueous solution of polyoxyethylene nonyl phenol (concentration: $9.84\times10^{-3}$ mol/l) were mixed. The air within the system was replaced by nitrogen gas while the mixture was being stirred at 250 rpm. The solution was then adjusted to a temperature of 250° C. To the solution was then added 10 ml of an aqueous solution of ammonium salt of cerium (IV) (concentration: $0.984\times10^{-3}$ mol/l). At this point, the solution was adjusted to a pH value of from 1.3 to 1.4 with an aqueous solution of ammonium nitrate (concentration: $58.8\times10^{-3}$ mol/l). The solution was then stirred for 8 hours. The solution thus obtained had a solid concentration of 9.5% and comprised particles having an average particle diameter of 0.4 μm.

[Preparation of Microcapsule (b) Having a Compound Containing a Heat-reactive Functional Group Enclosed Therein]

40 g of xylylene diisocyanate, 10 g of trimethylolpropane diacrylate, 10 g of a 7/3 (molar ratio) copolymer of allyl methacrylate and butyl methacrylate and 0.1 g of Pionine A41C (produced by Takemoto Oil & Fat Co., Ltd.) were dissolved in 60 g of ethyl acetate as oil phase components. As an aqueous phase component there was prepared 120 g of a 4% aqueous solution of PVA205 (produced by KURARAY CO., LTD.). These oil phase components and aqueous phase component were then emulsified at 10,000 rpm by means of a homogenizer. Thereafter, to the emulsion was added 40 g of water. The mixture was stirred for 30 minutes at room temperature and then for 3 hours at a temperature of 40° C. The microcapsule solution thus obtained had a solid concentration of 20% and comprised particles having an average diameter of 0.5 μm.

[Preparation of Support]

(Preparation of Aluminum Substrate)

An aluminum plate (JIS A1050; thickness: 0.24 mm) was subjected to electrolytic graining in a nitric acid bath, anodization in a sulfuric acid bath and treatment with an aqueous solution of silicate in a known manner. The support thus obtained had Ra (central line surface roughness) of 0.25 μm. The support had an anodized layer formed thereon in an amount of 2.5 g/m$^2$. The amount of silicon attached to the support was 10 mg/m$^2$.

(Heat-sensitive Layer Coating Solution Containing a Particulate Polymer Having a Heat-reactive Functional Group)

| | |
|---|---|
| Synthesized thermoplastic particulate polymer (see Table 2) (as calculated in terms of solid content) | 5 g |
| Synthesized particulate polymer having a heat-reactive functional group (a) | 1.5 g |
| Polyhydroxyethyl acrylate (weight-average molecular weight: 25,000) | 0.5 g |
| Infrared-absorbing dye (I-32) | 0.3 g |
| Water | 100 g |

(Heat-sensitive Layer Coating Solution Containing Microcapsules Having a Heat-reactive Functional Group- containing Compound Enclosed Therein)

| | |
|---|---|
| Synthesized thermoplastic particulate polymer (see Table 2) (as calculated in terms of solid | 5 g |

-continued

| | |
|---|---|
| content) | |
| Prepared microcapsule (b) | 1.5 g |
| Infrared-absorbing dye (1-32) | 0.3 g |
| Water | 60 g |
| 1-Methoxy-2-propanol | 40 g |

The foregoing heat-sensitive layer coating solutions were each applied, and then dried in an oven at a temperature of 100° C. for 60 seconds to prepare heat-sensitive layers (Sample Nos. 1 to 20). The coated amount of these heat-sensitive layer coating solutions was predetermined such that the coated amount of the thermoplastic particulate polymer reached 0.5 g/$m^2$.

The lithographic printing plate precursors thus obtained were then exposed to light in a Type 3244VFS trend setter (produced by Creo Corporation) having a water-cooled 40 W infrared semiconductor laser mounted thereon at an output of 9 W, an outer drum rotary speed of 210 rpm, a printing surface energy of 200 mJ/$cm^2$ and a resolution of 2,400 dpi.

A water droplet in an amount of 0.5 $\mu$l was put on the exposed surface of the lithographic printing plate precursor. The contact angle of the water droplet with respect to the exposed surface of the lithographic printing plate precursor was then measured by means of a standard goniometer.

The lithographic printing plate precursors which had thus been exposed to light were then each mounted untreated on the cylinder of a Type SOR-M printing machine produced by Heidelberg Inc. A fountain solution was then supplied onto the lithographic printing plate precursor. An ink was then supplied onto the lithographic printing plate precursor. Paper was then supplied into the printing machine to effect printing. All the printing plates could be subjected to on-the-machine development without any problem, allowing printing. The number of printed matters obtained with the various printing plates is set forth in Table 2.

TABLE 2

| | Thermoplastic particulate polymer | | | | | Microcapsule containing particulate polymer having heat-reactive group or compound having heat-reactive group | | 200 mJ/$cm^2$ | | |
|---|---|---|---|---|---|---|---|---|---|---|
| Sample No. | Kind | Added amount (mg/$m^2$) | Kind | Added amount (mg/$m^2$) | Poly-dispersibility | Kind | Added amount (mg/$m^2$) | Contact angle | Printable number of sheets | |
| 1 | (1) | 0.5 | — | — | — | — | — | 79 | 5,000 | Comparative Example |
| 2 | (2) | 0.5 | — | — | — | — | — | 78 | 6,000 | Comparative Example |
| 3 | (3) | 0.5 | — | — | — | — | — | 80 | 5,000 | Comparative Example |
| 4 | (4) | 0.5 | — | — | — | — | — | 79 | 5,000 | Comparative Example |
| 5 | (1) | 0.5 | — | — | — | (a) | 0.15 | 78 | 15,000 | Present invention |
| 6 | (2) | 0.5 | — | — | — | (a) | 0.15 | 77 | 15,000 | Present invention |
| 7 | (3) | 0.5 | — | — | — | (a) | 0.15 | 79 | 15,000 | Present invention |
| 8 | (4) | 0.5 | — | — | — | (a) | 0.15 | 80 | 15,000 | Present invention |
| 9 | (1) | 0.5 | — | — | — | (b) | 0.15 | 81 | 25,000 | Present invention |
| 10 | (2) | 0.5 | — | — | — | (b) | 0.15 | 77 | 25,000 | Present invention |
| 11 | (3) | 0.5 | — | — | — | (b) | 0.15 | 76 | 25,000 | Present invention |
| 12 | (4) | 0.5 | — | — | — | (b) | 0.15 | 77 | 25,000 | Present invention |
| 13 | (1) | 0.4 | (4) | 0.1 | >0.2 | (b) | 0.15 | 82 | 35,000 | Present invention |
| 14 | (1) | 0.25 | (4) | 0.25 | >0.2 | (b) | 0.15 | 84 | 35,000 | Present invention |
| 15 | (2) | 0.4 | (5) | 0.1 | >0.2 | (b) | 0.15 | 82 | 35,000 | Present invention |
| 16 | (2) | 0.25 | (5) | 0.25 | >0.2 | (b) | 0.15 | 85 | 35,000 | Present invention |
| 17 | (1) | 0.4 | (3) | 0.1 | >0.2 | (b) | 0.15 | 87 | 35,000 | Present invention |
| 18 | (4) | 0.4 | (3) | 0.1 | >0.2 | (b) | 0.15 | 88 | 45,000 | Present invention |
| 19 | (6) | 0.5 | — | — | — | (a) | 0.15 | 87 | 2,000 | Comparative Example |
| 20 | (6) | 0.5 | — | — | — | (b) | 0.15 | 86 | 1,000 | Comparative Example |

As can be seen in the results shown in Table 2, the constituent sample Nos. 5 to 18 of the invention exhibit a remarkable improvement of impression capacity. In particular, the constituents (Sample Nos. 13 to 18) comprising a heat-sensitive layer made of particulate polymer having different particle sizes or Tg values exhibit good properties.

Example 2

The procedure of Sample No. 11 of Example 1 was followed except that the presence of overcoat layer (OC layer), and the kind and added amount of light-to-heat converting layer were changed as set forth in Table 3. Thus, Sample Nos. 21 to 24 were prepared.

(Application of Overcoat Layer)

Overcoat layer coating solutions having the following formulation were each applied to the heat-sensitive layer of Sample Nos. 22 to 24, and then dried at a temperature of 100° C. for 2 minutes to prepare lithographic printing plate precursors comprising an overcoat layer in a dried coated amount of about 1.0 g/$m^2$.

(Overcoat layer coating solution)

| | |
|---|---|
| Polyvinyl alcohol (PVA-105, produced by KURARAY CO., LTD.) | 2.15 g |
| Polyvinyl pyrrolidone (K30, produced by GAF) | 0.15 g |
| Water-soluble dye (I-32) described herein (amount set forth in Table 3) | |
| Polyoxyethylene nonyl phenyl ether | 0.04 g |
| Water | 42 g |

The evaluation of impression capacity and contact angle were conducted in the same manner as in Example 1 except that exposure was effected at a surface energy of 400 mJ/$cm^2$.

TABLE 3

| | | Light-to-heat converting material | | 200 mJ/$cm^2$ | | 400 mJ/$cm^2$ | |
|---|---|---|---|---|---|---|---|
| Sample No. | OC layer | Light-to-heat converting material layer | Added amount (g/$m^2$) | Contact angle | Printable number of sheets | Contact angle | Printable number of sheets |
| 21 | None | Heat-sensitive layer | 30 | 76 | 25,000 | 90 | 25,000 |
| 22 | Present | Heat-sensitive layer | 30 | 76 | 25,000 | 91 | 25,000 |
| 23 | Present | OC layer | 30 | 90 | >30,000 | 102 | 35,000 |
| 24 | Present | Heat-sensitive layer | 15 | 100 | >35,000 | 102 | >35,000 |
| | | OC layer | 15 | | | | |

As can be seen in Table 3, the arrangement comprising a light-to-heat converting material incorporated in OC layer exhibits a high contact angle and a sufficient impression capacity even when exposed to light at a printing surface energy of 200 mJ/$cm^2$.

What is claimed is:

1. A lithographic printing plate precursor comprising a hydrophilic support having thereon a heat-sensitive layer containing:

at least one of a particulate polymer having a heat-reactive group and a microcapsule containing a compound having a heat-reactive group incorporated therein; and a separate thermoplastic particulate polymer having Tg of not lower than 60° C.

2. The lithographic printing plate precursor according to claim 1, wherein said thermoplastic particulate polymer comprises at least two thermoplastic particulate polymers having different particle sizes.

3. The lithographic printing plate precursor according to claim 2, wherein said thermoplastic particulate polymer has an average particle diameter of 0.005 μm to 2.0 μm.

4. The lithographic printing plate precursor according to claim 1, wherein said thermoplastic particulate polymer comprises at least two thermoplastic particulate polymers having different Tg values.

5. The lithographic printing plate precursor according to claim 1, wherein said thermoplastic particulate polymer has an average particle diameter of 0.005 μm to 2.0 μm.

6. The lithographic printing plate precursor according to claim 1, wherein said microcapsule has an average particle diameter of 0.01 μm to 20 μm.

7. A lithographic printing plate precursor comprising a hydrophilic support having thereon a heat-sensitive layer containing:

at least one of a particulate polymer having a heat-reactive group and a microcapsule containing a compound having a heat-reactive group incorporated therein; and a separate thermoplastic particulate polymer having Tg of not lower than 60° C. which does not have a heat-reactive group.

8. The lithographic printing plate precursor according to claim 7, wherein the heat-reactive group is selected from the group consisting of a polymerizable unsaturated group, a hydroxyl group, a carboxyl group, an acid anhydride, an amino group, an epoxy group, an isocyanate group, and block fbrm thereof.

9. The lithographic printing plate precursor according to claim 8, wherein the heat-reactive group is a polymerizable unsaturated group.

* * * * *